(12) United States Patent
Wong et al.

(10) Patent No.: US 10,561,581 B2
(45) Date of Patent: Feb. 18, 2020

(54) OBJECT DETECTING DEVICE USING MULTI-TOUCH PRESSURE-SENSING

(71) Applicant: Aam Care, Inc., Boston, MA (US)

(72) Inventors: Jiun Lang Wong, Hong Kong Island (HK); Aya Katherine Suzuki, Cambridge, MA (US)

(73) Assignee: Aam Care, Inc., Brooklyn, NY (US)

( * ) Notice: Subject to any disclaimer, the term of this patent is extended or adjusted under 35 U.S.C. 154(b) by 0 days.

(21) Appl. No.: 16/201,387

(22) Filed: Nov. 27, 2018

(65) Prior Publication Data
US 2019/0192384 A1    Jun. 27, 2019

Related U.S. Application Data

(60) Provisional application No. 62/590,825, filed on Nov. 27, 2017.

(51) Int. Cl.
| | |
|---|---|
| A61J 7/02 | (2006.01) |
| G08B 21/18 | (2006.01) |
| G01L 5/166 | (2020.01) |
| A61J 1/03 | (2006.01) |
| A61J 7/04 | (2006.01) |
| G01L 5/161 | (2020.01) |
| G01L 1/22 | (2006.01) |
| G01L 1/18 | (2006.01) |
| H05K 1/18 | (2006.01) |
| H05K 1/11 | (2006.01) |
| G06M 1/27 | (2006.01) |

(52) U.S. Cl.
CPC .................. *A61J 7/02* (2013.01); *A61J 1/035* (2013.01); *A61J 7/04* (2013.01); *G01L 1/18* (2013.01); *G01L 1/2293* (2013.01); *G01L 5/161* (2013.01); *G01L 5/166* (2013.01); *G08B 21/18* (2013.01); *A61J 2200/30* (2013.01); *A61J 2200/70* (2013.01); *A61J 2200/74* (2013.01); *G06M 1/27* (2013.01); *H05K 1/115* (2013.01); *H05K 1/181* (2013.01); *H05K 2201/09409* (2013.01); *H05K 2201/10121* (2013.01); *H05K 2201/10151* (2013.01); *H05K 2201/10174* (2013.01)

(58) Field of Classification Search
None
See application file for complete search history.

(56) References Cited

U.S. PATENT DOCUMENTS

| | | | |
|---|---|---|---|
| 2010/0242629 A1* | 9/2010 | Leuenberger | A61J 1/035 73/862.625 |
| 2010/0243507 A1* | 9/2010 | Gelardi | B65D 73/0085 206/531 |

(Continued)

*Primary Examiner* — John F Mortell
(74) *Attorney, Agent, or Firm* — Fenwick & West LLP

(57) ABSTRACT

According to one or more embodiments of the present disclosure, a pill detection apparatus may comprise a blister pack receiving container, an elastomeric connector layer; and a printed circuit board (PCB) layer disposed beneath the elastomeric connector layer. The PCB layer may include a plurality of touch points, wherein each touch point of the plurality of touch points is configured to, when the blister pack is disposed on top of the elastomeric connector layer, sense whether a respective region of the blister pack is in contact with the elastomeric connector layer. The PCB layer may include a plurality of IR sensors sense properties of a respective region of the blister pack.

20 Claims, 26 Drawing Sheets

(56) References Cited

U.S. PATENT DOCUMENTS

| | | | |
|---|---|---|---|
| 2010/0274155 A1* | 10/2010 | Battrell | A61B 10/0096 600/572 |
| 2016/0013523 A1* | 1/2016 | Anzicek | H01M 10/486 429/61 |
| 2016/0103085 A1* | 4/2016 | Mehregany | H05K 7/02 324/71.1 |
| 2016/0158109 A1* | 6/2016 | Nova | G06F 19/3462 206/534 |

* cited by examiner

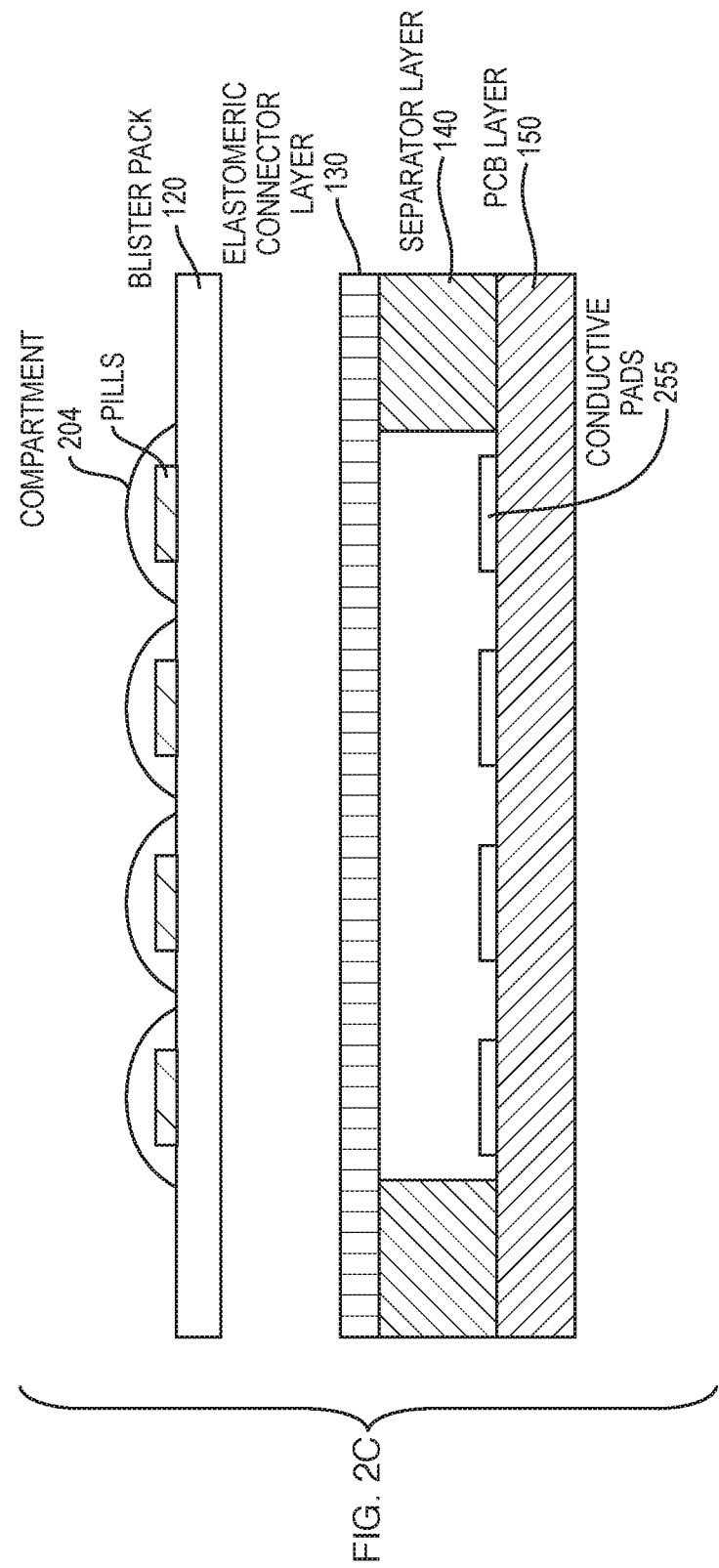

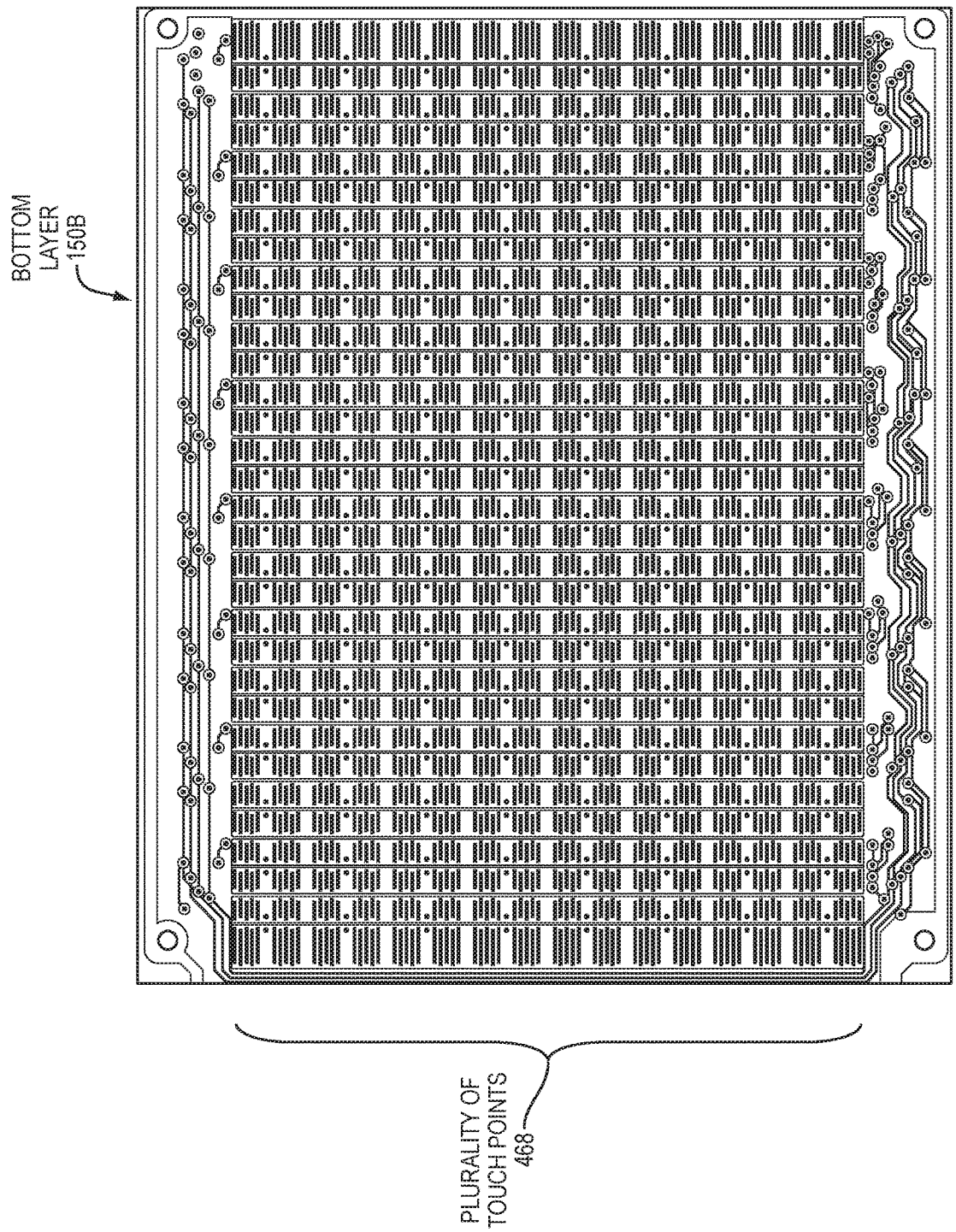

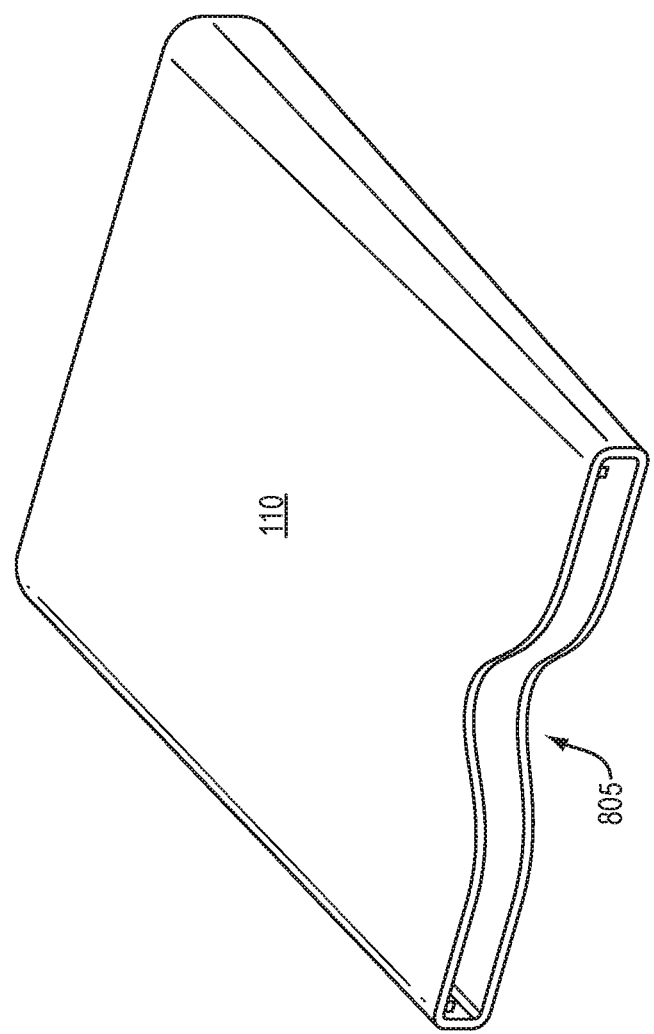

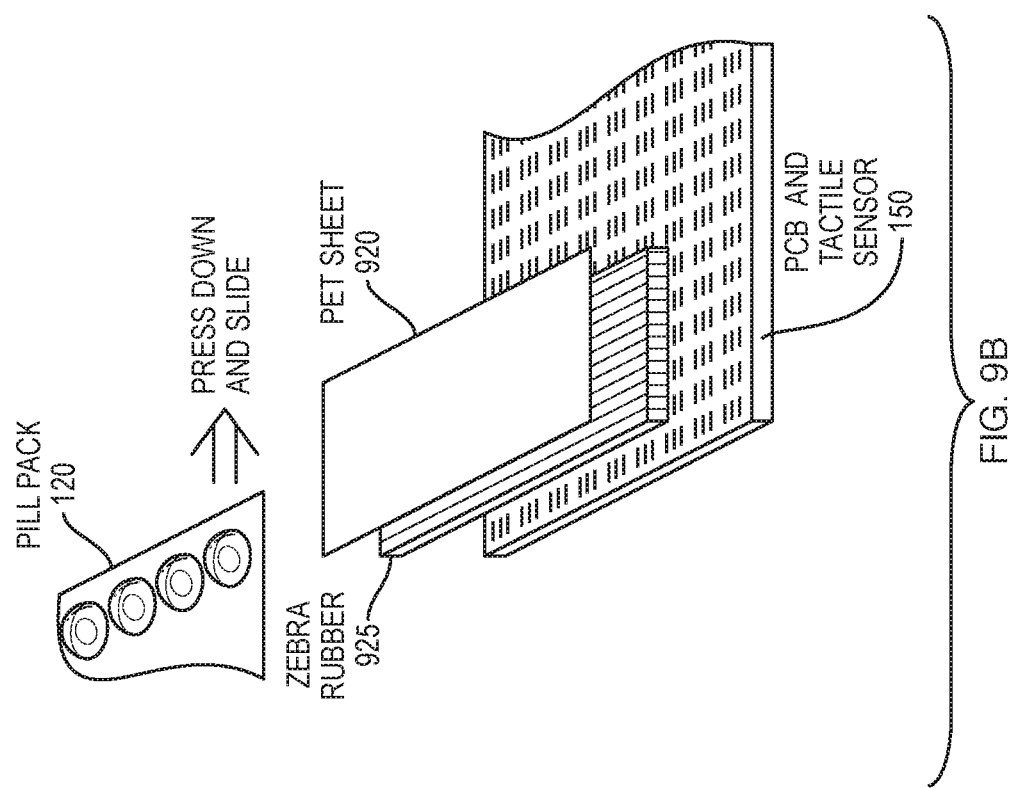

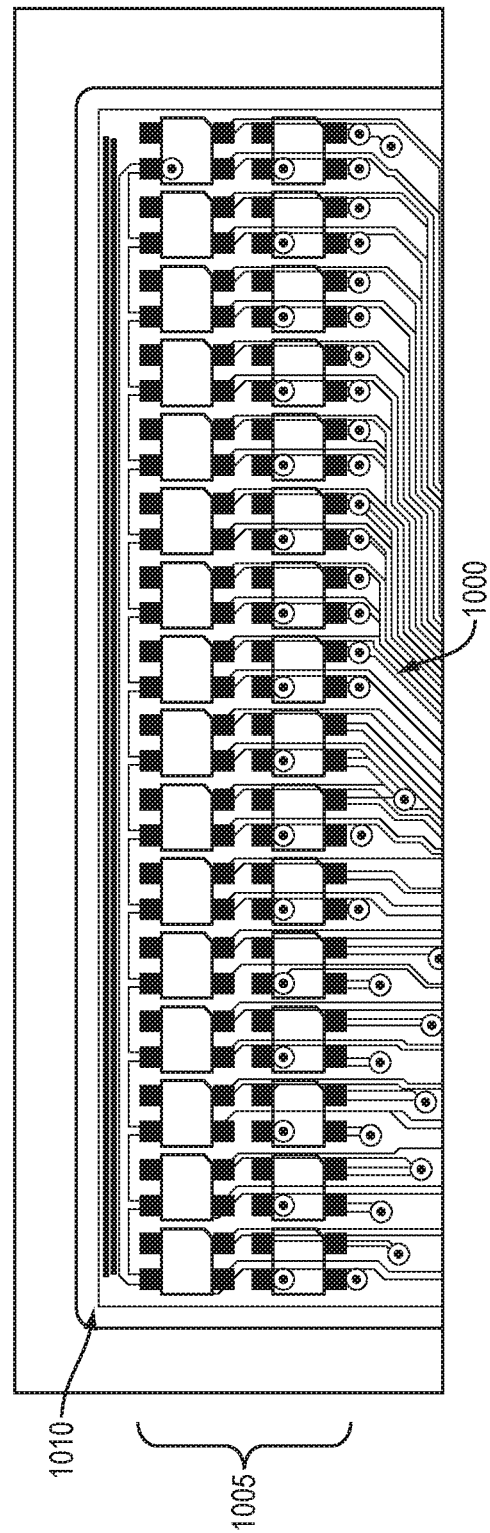

OBJECT DETECTING DEVICE USING MULTI-TOUCH PRESSURE-SENSING

RELATED APPLICATION

This application claims priority to U.S. Provisional Patent Application No. 62/590,825, filed on Nov. 27, 2017, entitled "OBJECT DETECTING DEVICE USING MULTI-TOUCH PRESSURE-SENSING" by Suzuki et al., the contents of which are incorporated by reference herein.

TECHNICAL FIELD

The present disclosure relates generally to techniques for detecting and determining, by a device, a number of pills and positions of the pills in a blister pack.

BACKGROUND

It is important for patients to take their prescribed medication on time and in their proper order. For example, some pills need to be taken in a particular regimen in order to build an effective dose level in the body. This is particularly true for birth control pills, in which levels of hormone doses change per day and therefore must be taken in order and on a prescribed date. In addition, it is common for the last week of a month's prescription to include sugar pills, which are provided to ensure the patient remains on a routine of taking pills for the following month.

However, despite the importance of taking the proper pills in their proper sequence, many patients, at some point during their treatment, either forget to take their medication on a particular day or accidentally take them in the wrong order, putting them at risk. While there are techniques and devices to help organize a patient's medication to help track their proper usage, medication compliance remains a significant issue with very few accurate existing solutions. In particular, it is important to not only detect the number of pills left in a blister pack but also to determine their position to assess whether the proper dosage has been taken.

SUMMARY

According to one or more embodiments of the present disclosure, a pill detection apparatus may comprise a blister pack receiving container, an elastomeric connector layer, and a printed circuit board (PCB) layer disposed beneath the elastomeric connector layer. The PCB layer may include a plurality of touch points, wherein each touch point of the plurality of touch points is configured to, when the blister pack is disposed on top of the elastomeric connector layer, sense whether a respective region of the blister pack is in contact with the elastomeric connector layer and in some cases, how hard the blister pack is pressing against the elastomeric connector layer.

Specific embodiments of the pill detection apparatus (and object-detecting devices generally) are further described below. In addition, according to embodiments of the present disclosure, a method of detecting the number and position of objects, such as in a blister pack, inserted into or placed into the apparatus is also described.

BRIEF DESCRIPTION OF THE DRAWINGS

The embodiments herein may be better understood by referring to the following description in conjunction with the accompanying drawings in which like reference numerals indicate identically or functionally similar elements, of which:

FIG. 2A-2C illustrate cross-sectional exploded views of an embodiment of the object-detecting device;

FIGS. 4A-4B illustrate detailed views of a bottom layer of the PCB layer;

FIGS. 8A-8C illustrate example structural embodiments of a case cover of a pill detection device;

FIGS. 9A-9B illustrate an alternative embodiment of the pill detection device;

FIG. 10 illustrates an embodiment of a pill detection device that includes a plurality of infrared (IR) sensors;

Figure 1A:
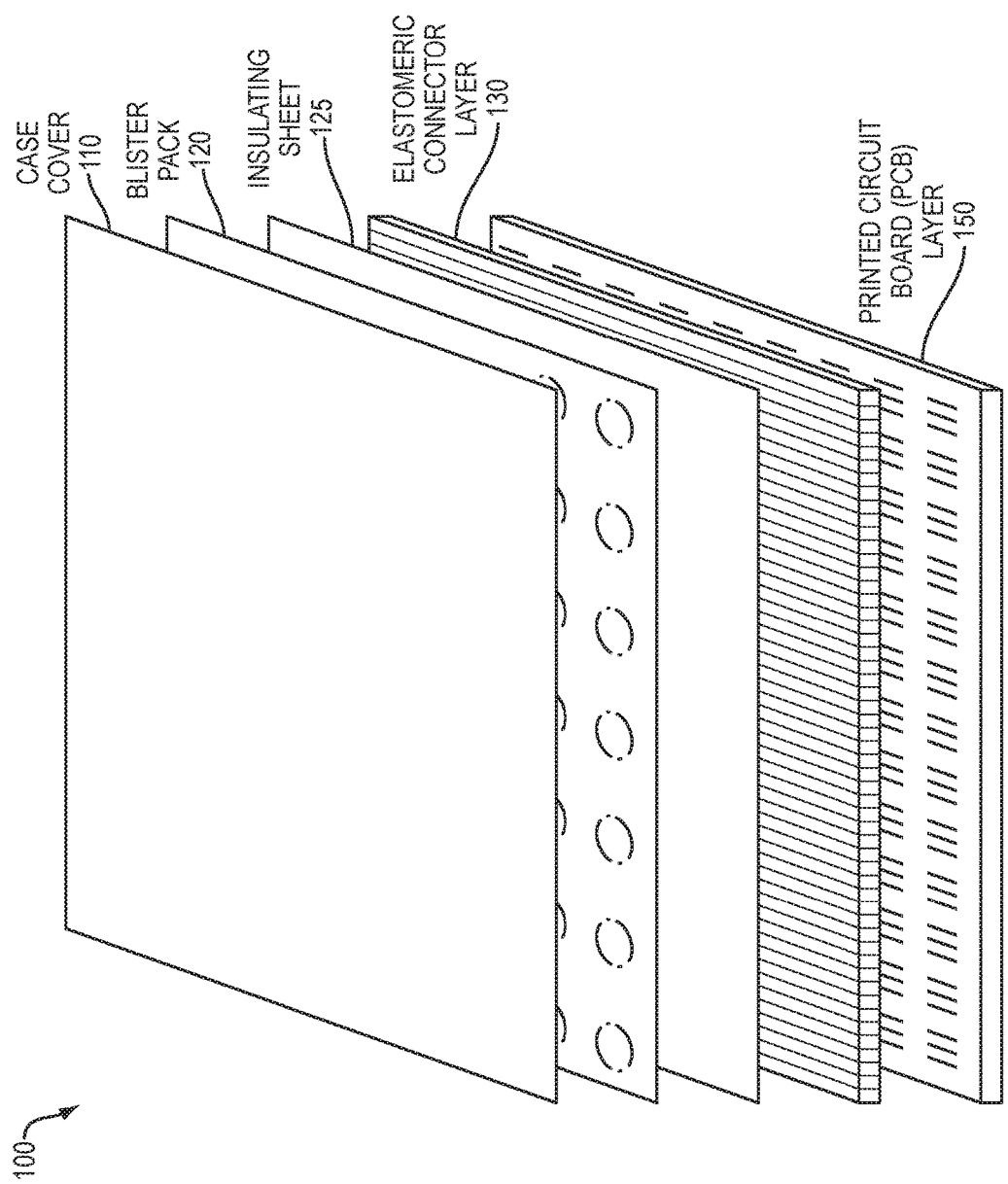
FIGS. 1A-1B illustrate exploded schematic views of embodiments of an object-detecting device.

It should be understood that the above-referenced drawings are not necessarily to scale, presenting a somewhat simplified representation of various preferred features illustrative of the basic principles of the disclosure. The specific design features of the present disclosure, including, for example, specific dimensions, orientations, locations, and shapes, will be determined in part by the particular intended application and use environment.

DETAILED DESCRIPTION

As discussed above, medication compliance is a huge issue with very few accurate existing solutions. It is often important for a patient to not only keep track of how often they are taking their prescribed medication but also if they are taking them on the correct day and in the correct order.

The present device addresses the above issues. In particular, an object-detecting device, specifically a pill detection apparatus, described herein not only can be used to identify the presence or absence of an object in a holder, such as a pill in a blister pack, but can also more particularly identify a position of each object within the holder, using a multi-layer pressure-sensing composite. In some embodiments, the composite includes a single elastomeric connector sheet that is capable of changing its local electrical resistance in response to local compressive forces. As a specific embodiment, the techniques described herein provide for a pill-detecting and counting device that is capable of determining if medication has been taken properly by a patient. By detecting both the number and position of pills left in a blister pack, for example, the device can track the patient's compliance and send smart reminders to the patient depending on the state of the blister pack. This information can also be sent to the patient's significant others, family, primary care physician, and pharmaceutical companies who wish to gain data regarding the patient's compliance to a specific medication.

In more detail, in some embodiments, the techniques herein provide for a multi-touch pressure-sensing device with a plurality of regions (e.g., pads or keys) that may be pressed down on simultaneously, such as by the presence of a pill in a blister pack. The device can detect the pressure being exerted on each pad using a single elastomeric connector layer, which is capable of changing its local electrical resistance in response to local compressive forces. In another embodiment, in lieu or in addition to multi-touch pressure sensing, the techniques herein provide for an infrared (IR) based scanning device that can detect the presence of the pill in the blister pack.

In general, the pill detection apparatus comprises an outer case (e.g., a blister pack receiving container) comprising at least a case cover, into which an object container holding one or more objects (in particular, a blister pack) may be inserted or placed. The case cover may be rigid (e.g., plastic or metal) in order to provide inward pressure to the object in the object container, although, in some embodiments, the cover may be flexible or pliable yet having sufficient rigidity to exert the desired pressure (e.g., leather). The case cover can be in, as will be described in greater detail below, a slide-in style or a clam shell style.

The object container, in some embodiments, may be a blister pack containing medication, such as one or more pills or capsules. The object container may comprise an array of separated compartments, such as raised pockets, configured to hold one or more objects and may further comprise a frangible layer sealing the compartment. When the outer surface of a particular pocket is compressed towards the frangible layer, the object may be pressed against the frangible layer to puncture the layer, thereby allowing the object to be ejected or otherwise removed from the pocket. Alternatively, or in addition, a portion of the frangible layer may be removed to at least partially unseal the compartment, providing access to the object within the object container pocket. In either case, the object container may include an array of sealed compartments having an object present (e.g., medication) and may, in some embodiments, further include one or more unsealed compartments that had initially contained an object but, from which, the object has been removed.

The pressure-detecting device comprises an elastomeric connector layer comprising alternating parallel conductive and non-conductive regions, both of which may be flexible and compressible. In addition, the device may further comprise a separator layer, which is configured to provide a space or gap into which a portion of the elastomeric connector layer may be compressed. In addition, a thin insulating sheet may disposed on top of the elastomeric connector layer, where the thin insulating sheet can provide reduced friction and smoothness for insertion of a blister pack into pill detection apparatus.

The device may further comprise a sensor pad layer, which, in some embodiments, may be a printed circuit board (PCB). The sensor pad layer may include a plurality of conductive pads, diodes, and resistors placed in a matrix pattern (rows and columns), as described in more detail below. The conductive pads may be positioned beneath the elastomeric connector layer so that, when compressed, at least a portion of the elastomeric connector layer may come into contact with a conductive pad. In addition, the sensor pad layer may further comprise additional components configured to detect both the number and position of objects present or absent from the object container, including shift registers (e.g., both column and row shift registers), conductive traces, insulating junctions, and vias, as well as a multiplexer and a microcontroller unit (MCU). In some embodiments, the shift registers may be used to control the multiplexers to reduce the need for input/output pins from the MCU.

Specific embodiments and components of the multi-touch pressure-sensing device are shown in FIGS. 1-11 and discussed in more detail below. However, it should be apparent to those skilled in the art that these are merely illustrative in nature and not limiting, being presented by way of example only. Numerous modifications and other embodiments are within the scope of ordinary skill in the art and are contemplated as falling within the scope of the present disclosure. In addition, those skilled in the art should appreciate that the specific configurations are exemplary and that actual configurations will depend on the specific system. Those skilled in the art will also be able to recognize and identify equivalents to the specific elements shown, using no more than routine experimentation.

With reference to FIG. 1A, an exploded schematic view of an embodiment of the object-detecting device described herein is shown. In the specific embodiment shown in the overall perspective view of FIG. 1A, a pill detection device 100 comprises a plurality (e.g., five) of planar layers in the following order: an outer case layer, such as case cover 110, beneath which blister pack 120, having pockets containing pills, may be placed or inserted; an insulating sheet 125; an elastomeric connector layer 130; and a printed circuit board (PCB) layer 150. As shown, elastomeric connector layer 130 may be a single planar sheet made with alternating lines of conductive and non-conductive regions in a rubber or elastomeric matrix such that the sheet is only conductive along one axis. The resistance of the elastomeric connector layer 130 sheet may change with the amount of pressure applied to it. For example, the higher the applied pressure, the lower the resistance. The insulating sheeting 125 can be made of polyethylene terephthalate (PET) sheet(s) and can reduce friction between the blister pack 120 and the elastomeric connector layer 130 as well as prevent wear and tear of the elastomeric connector layer 130. In an embodiment, the polyethylene terephthalate (PET) sheet(s) can be about, for example, 0.5 millimeters (mm) thin.

Figure 1B:
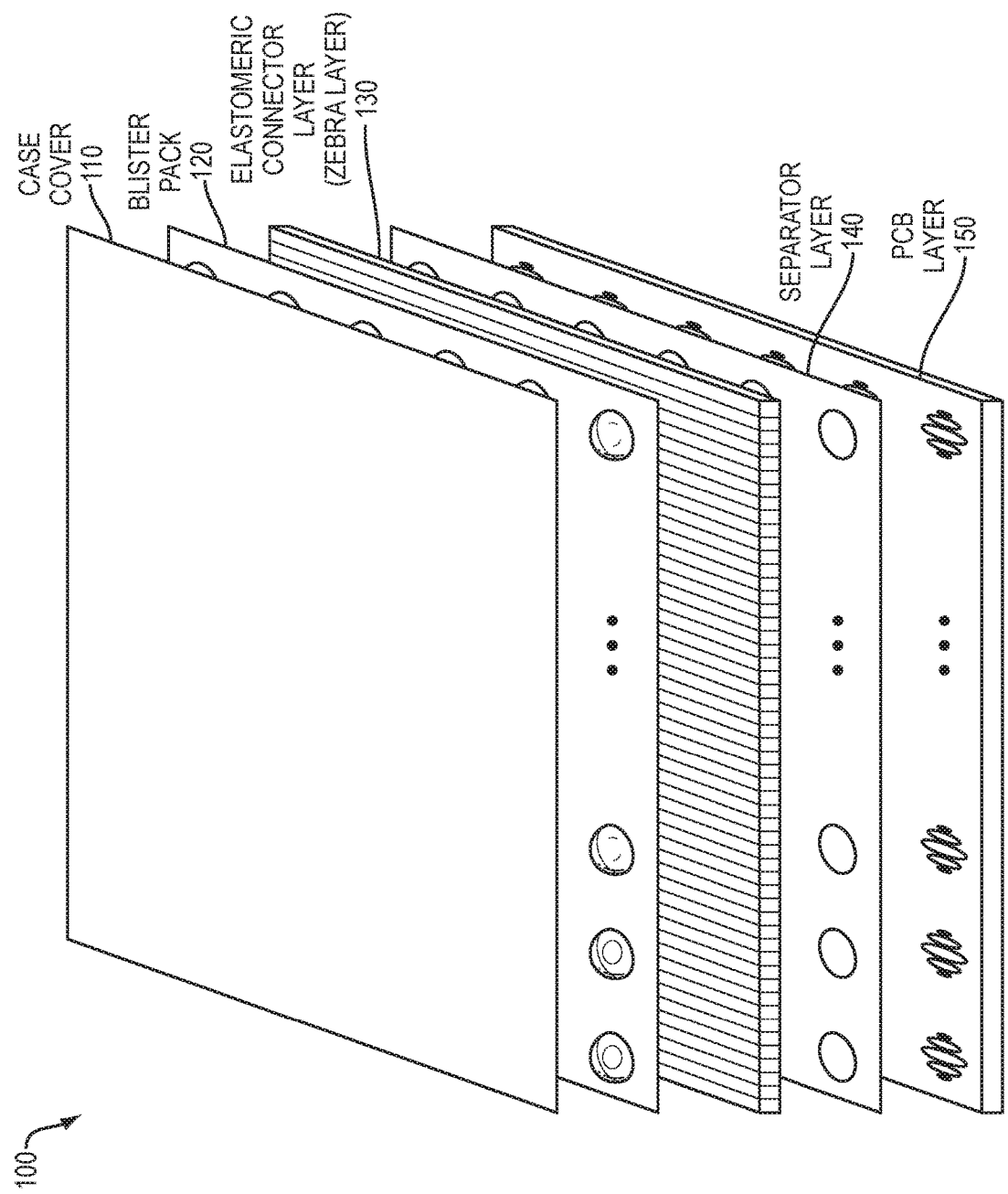

Turning to FIG. 1B, an exploded schematic view of an embodiment of the object-detecting device comprising a separator layer described herein is shown. In the specific embodiment shown in the overall perspective view of FIG. 1B, object-detecting device 100 comprises a plurality (e.g., five) of planar layers in, for example, the following order: the outer case layer, such the case cover 110, the blister pack 120; the elastomeric connector layer 130; a separator layer 140; and the PCB layer 150. The separator layer 140 separates elastomeric connector layer 130 and PCB layer 150 to avoid any electrical contact when an object (e.g., a pill) in blister pack 120 is absent.

Figure 2A:
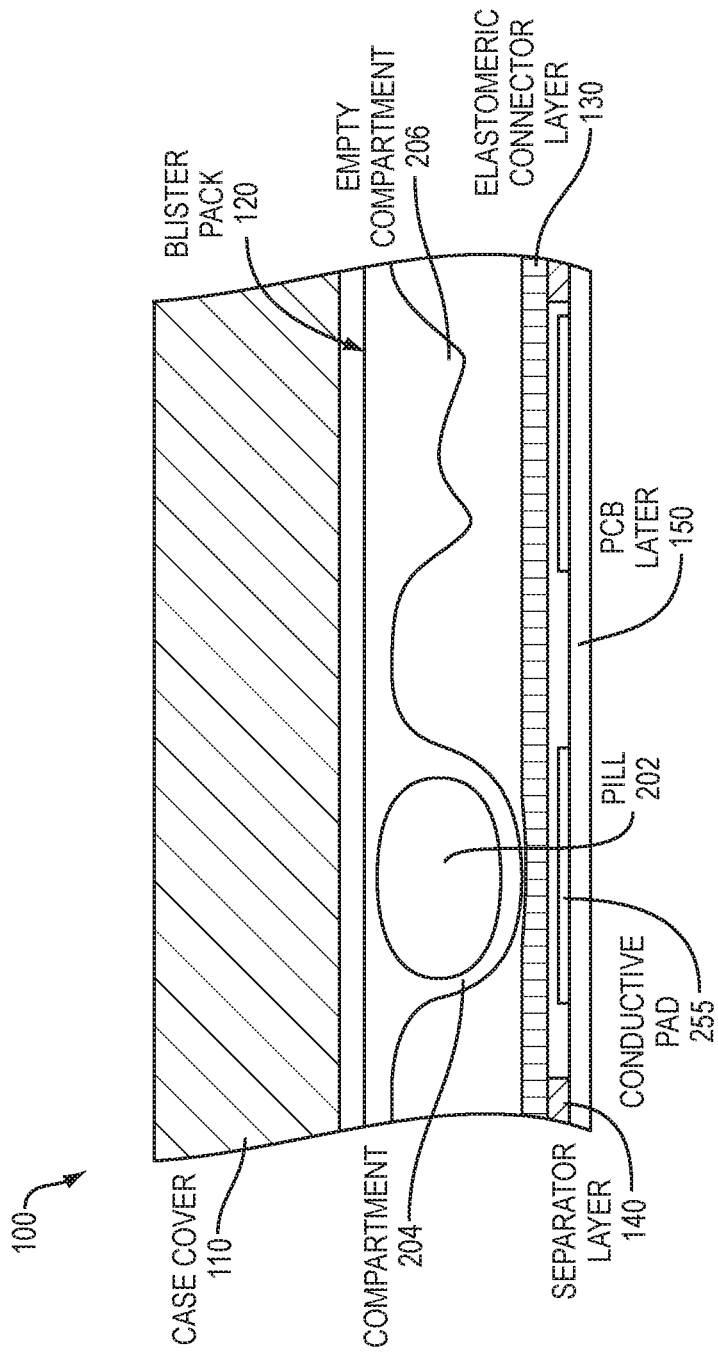
Figure 2B:
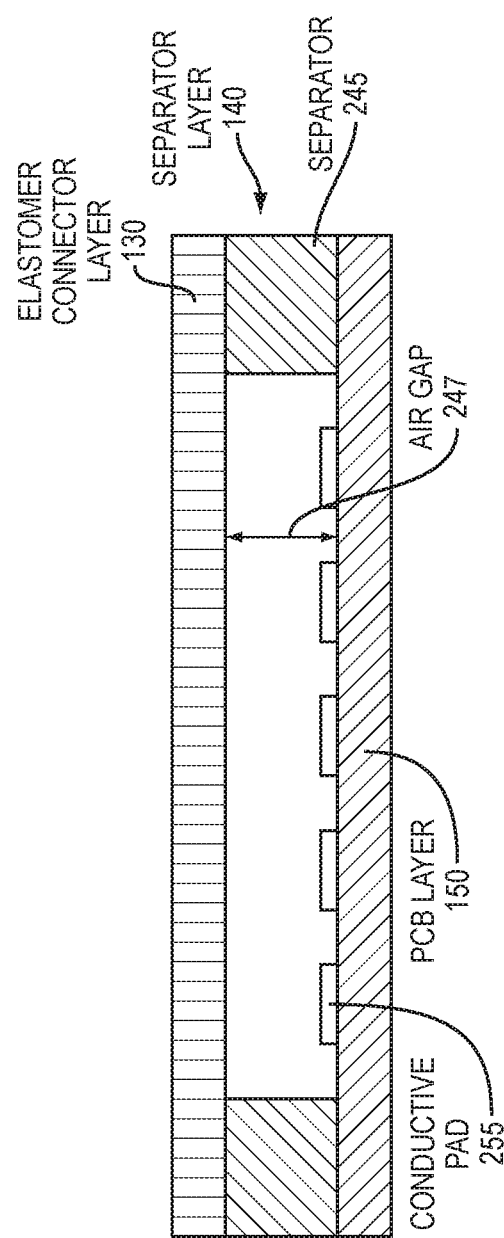

FIG. 2A-2C show cross-sectional exploded views of an embodiment of the object-detecting device. In particular, FIG. 2A shows a detailed exploded view of object-detecting device 100 with pill 202 present in compartment 204 of blister pack 120. The compartment containing the pill, in some embodiments, by contact with case cover 110 when the blister pack is inserted into the case, compresses part of elastomeric connector layer 130, which comes in contact with conductive pad 255 of the PCB layer 150. As shown, for empty compartment 206 (e.g., when a pill has been removed), elastomeric connector layer 130 is not compressed against the conductive pad 255 due to separator layer 140 or the lower height of the empty compartment. Further, it is to be understood that the blister pack 120 may be placed with pill compartments (e.g., empty compartment 206) facing either upwards to or downwards from the elastomeric connector layer 130. A multiplexer may receive a higher voltage reading from a conductive pad in contact with the elastomeric connector layer compared to a conductive pad that is not in contact with the elastomeric connector layer.

In FIG. 2B, a cross-sectional exploded view of elastomeric connector layer 130, separator layer 140, and PCB layer 150 is shown. A plurality of conductive pads 255 may be disposed between separators 245 of separator layer 140. The separators can be used to ensure formation of air gap 247 such that elastomeric connector layer 130 is not in contact with any of the conductive pads when a pill is absent (e.g., no down force is applied from the pill). The separators may be an insulator with a thickness as appropriate to maintain the air gap 347. Examples of specific dimensions of various components and layers are shown in FIG. 2C. In some embodiments, the separators may be made by spraying insulating paint on portions of PCB layer 150 that do not contain conductive pads or by applying small beads around the conductive pads to act as tiny bumps of separation. As such, separator layer 130 may be a part of PCB layer 150. Alternatively, the separator layer may be a distinct layer positioned between the elastomeric connector layer and the PCB layer.

It is to be understood that the separator layer 140 may not be required in an embodiment. For example, in another embodiment, the insulating sheet 125, as shown in FIG. 1A, may be used between the blister pack 120 (or the case cover 110 when no blister pack is present) and the elastomeric connector layer 130. Alternatively, it is to be understood that the separator layer 140 may be replaced by the insulating sheet 125 (as described herein above) that can separate the elastomeric connector layer 130 and the conductive pad 255.

Figure 3:
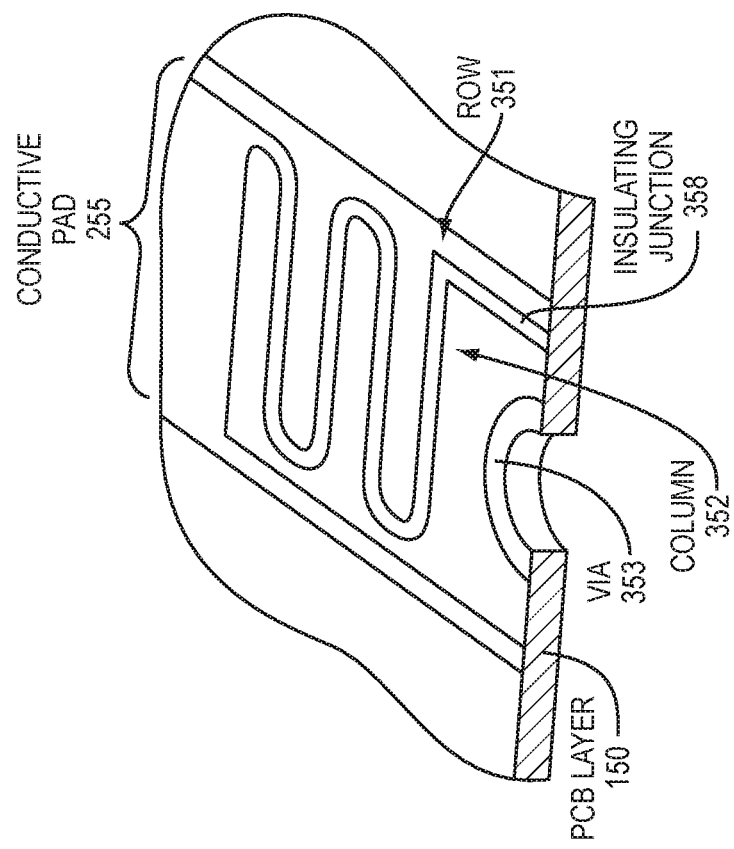
FIG. 3 illustrates a detailed view of a printed circuit board (PCB) layer of the object-detecting device.

FIGS. 3-8 show detailed views of embodiments of components of an object-detecting device. FIG. 3 shows a detailed view of PCB layer 150. As shown, the PCB layer comprises two layers, with the top layer being columns 352 and the bottom layer being rows 351, separated by insulating junction 358. A portion of conductive pad 355 (e.g., half) may be connected to the top layer while another portion (e.g., the other half) may be connected to the bottom layer. Via 353 electrically connects the PCB layers together so the sensors can be more densely packed.

Figure 4A:
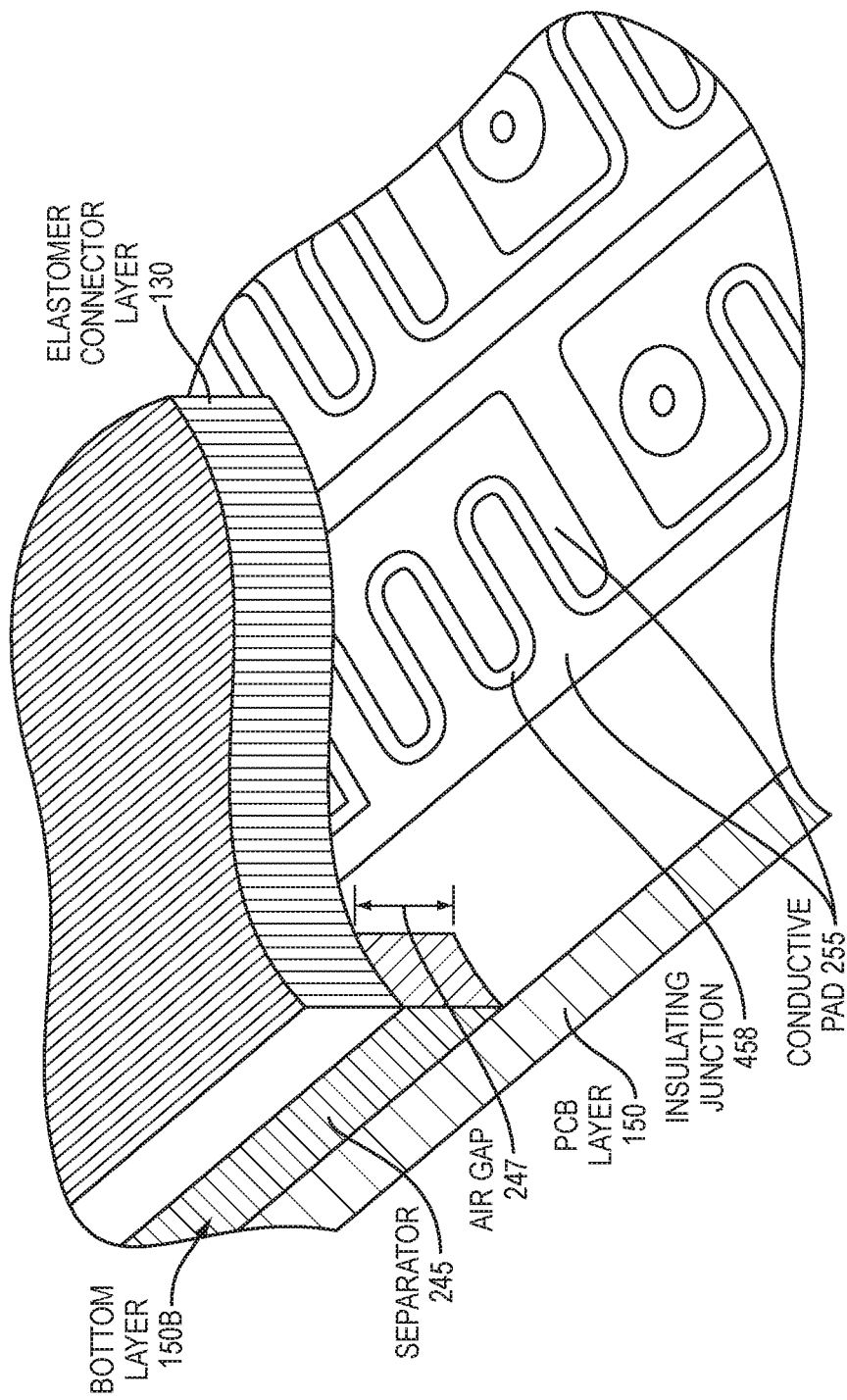

FIGS. 4A-4B show detailed views of a bottom layer 150B of the PCB layer 150. In FIG. 1A, the bottom layer 150B is to be understood as facing the elastomeric connector layer 130, so as to face towards the blister pack 120 when the blister pack 120 is within the case cover 110. With reference to FIG. 4A, conductive pads 255 are positioned on PCB layer 150, and insulating junction 458 acts as a switch (e.g., a miniature switch). FIG. 4B shows another view of the bottom layer 150B of the PCB layer 150, where a plurality of touch points 468 (or conductive pads) are shown. As shown, there are preferably about 512 touch points in the plurality of touch points 468.

Figure 5A:
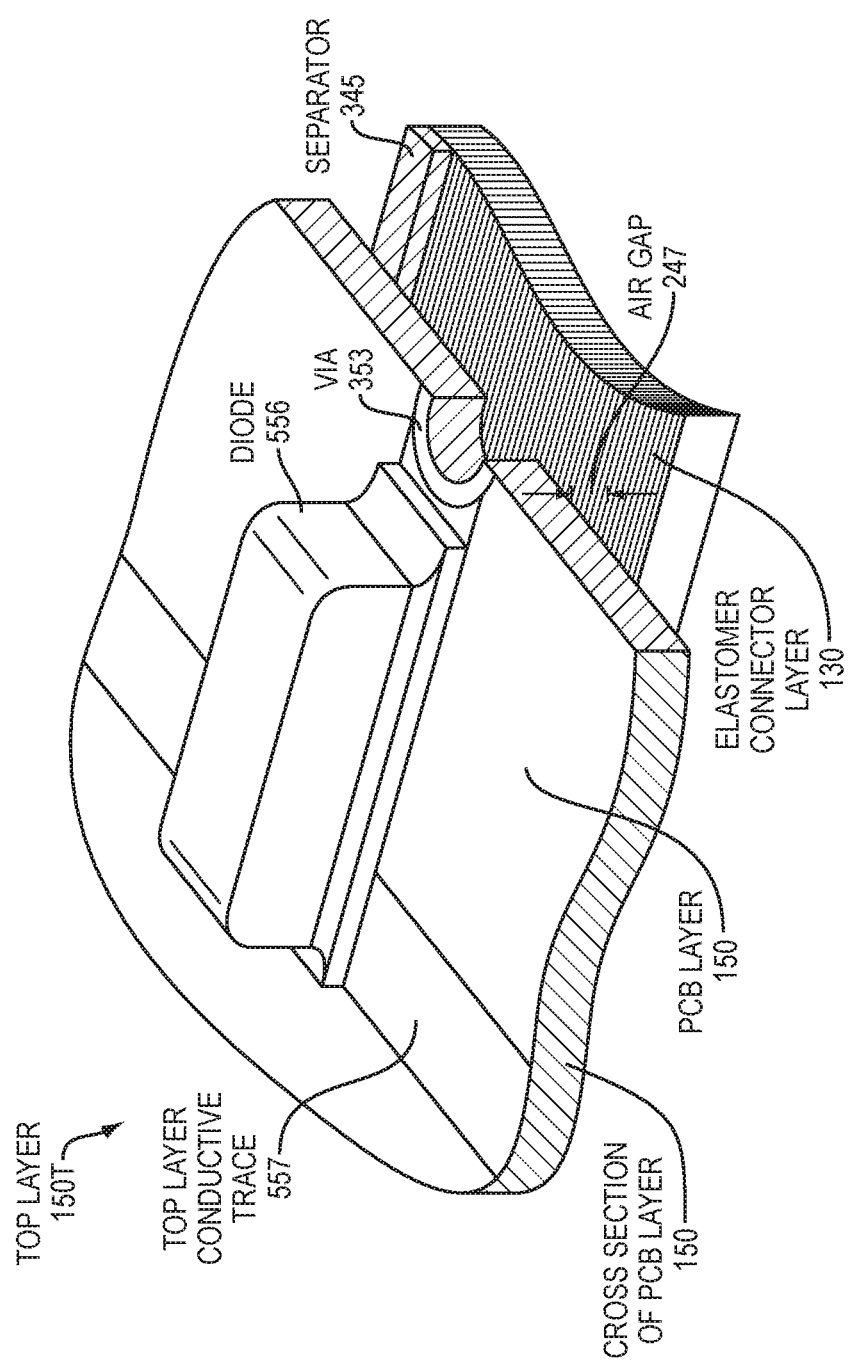
FIGS. 5A-5B illustrate detailed views of a top layer of the PCB layer.
Figure 5B:
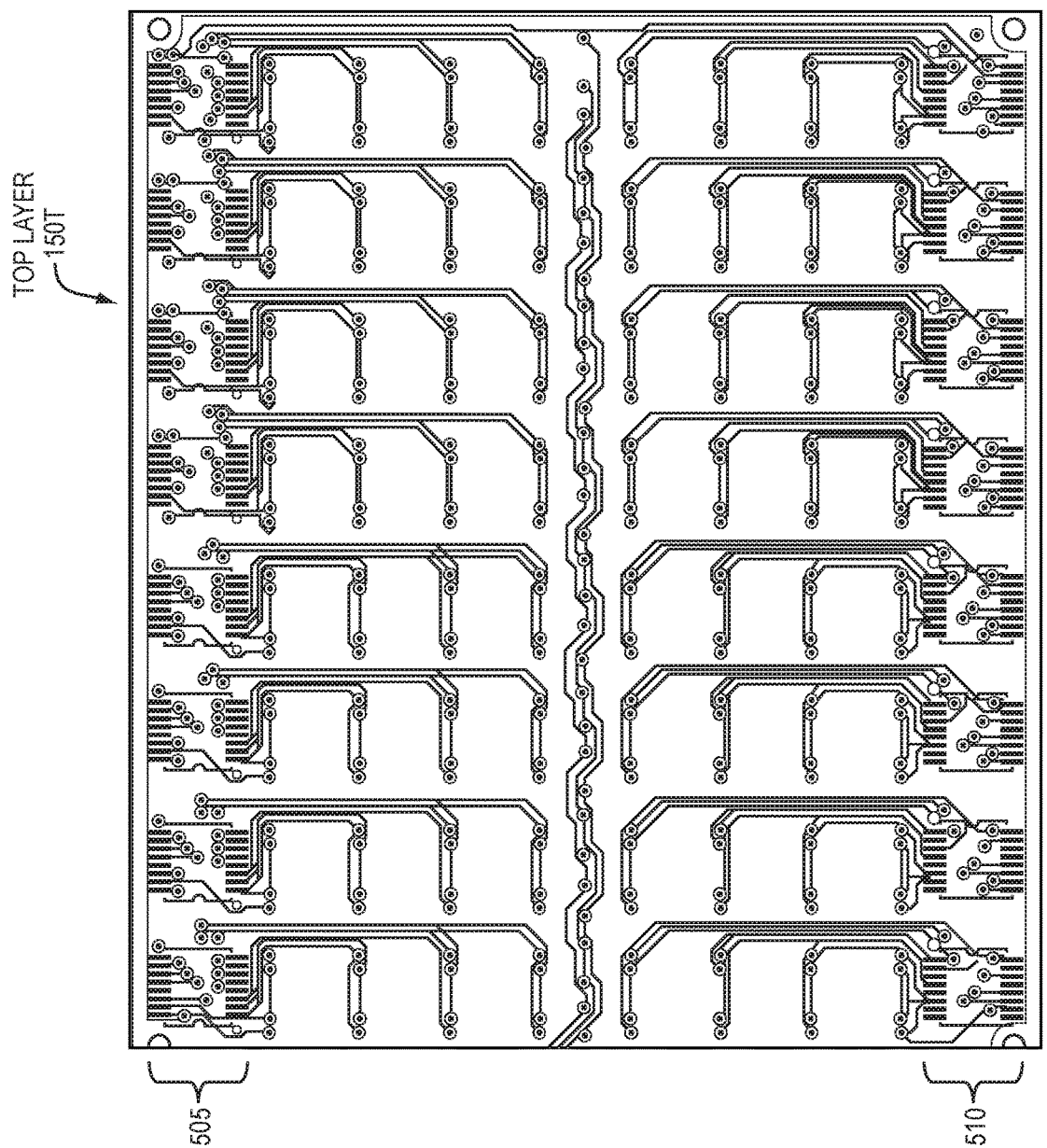

FIGS. 5A-5B show detailed views of a top layer 150T of the PCB layer 150. The top layer 150T is to be understood as facing away from the elastomeric connector layer 130, so as to face away from the blister pack 120 when it is within the case cover 110. As shown in FIG. 5A, diodes 556 and conductive traces 557 are positioned on PCB layer 150, with the conductive traces connecting diodes in column to shift registers, as will be described in greater detail herein below with reference to FIGS. 5C-5F. FIG. 5B shows a plurality of shift register footprints on the PCB layer 150. In the example shown, a first row 505 of shift register footprints are located near one edge of the PCB layer 150, and a second row 510 of shift register footprints are located near an opposite (to the one edge) of the PCB layer 150.

Figure 6:
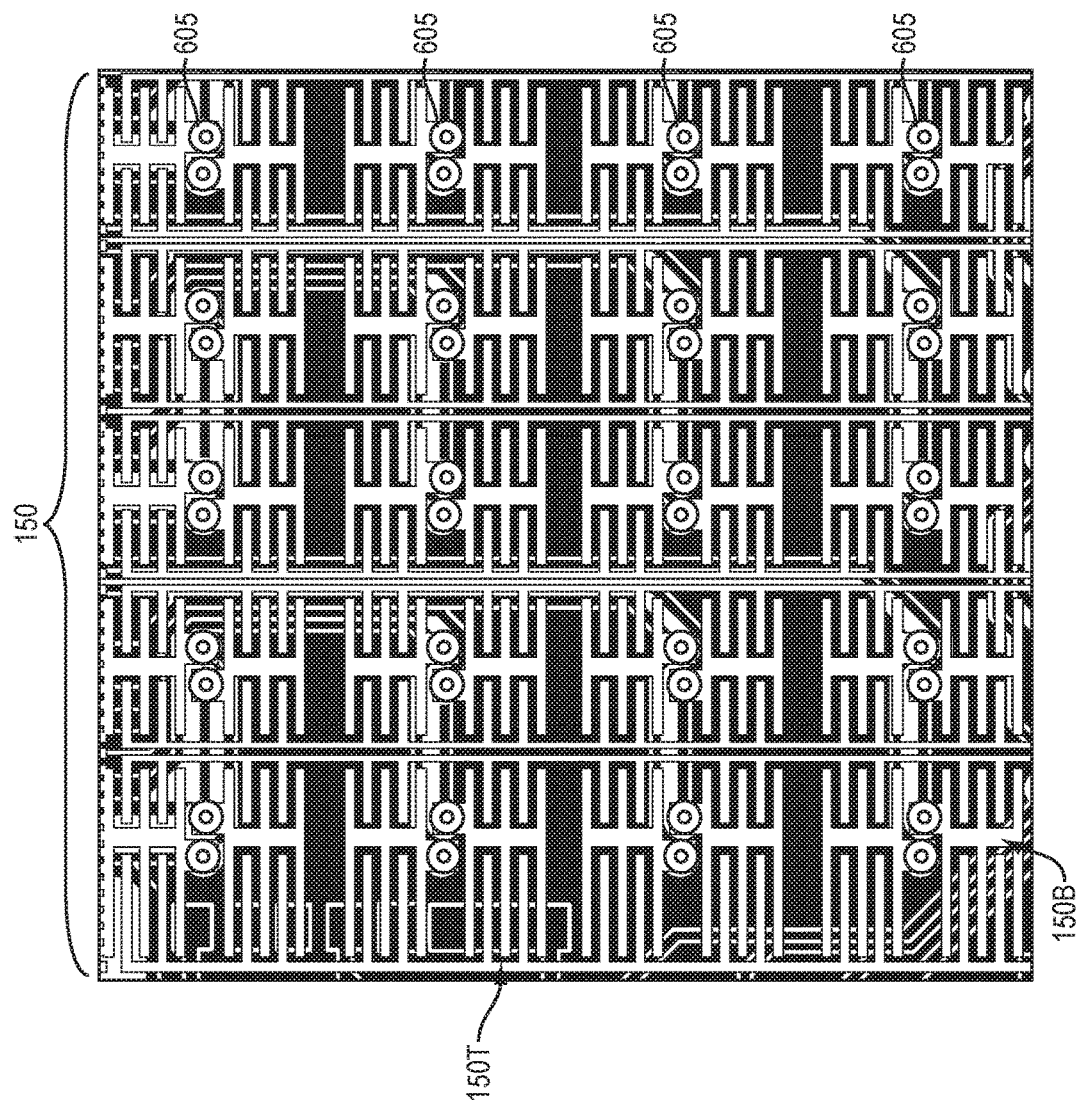
FIG. 6 illustrates a detailed view of the PCB layer.

FIG. 6 shows a detailed view of the PCB layer 150 with the bottom layer 150B superimposed on the top layer 150T. As shown, there may be a plurality of vias 605. Further the bottom layer of the 150B is shown as the clear portion of the PCB layer 150, and the top layer 150T is shown in solid black lines. In the embodiment shown, when eight channel shift registers are used, each shift register controls 32 tactile sensor touch points. When there are 16 shift registers, there would be a total of 512 touch points. It is to be understood that there could be any arbitrary number of touch points depending on the number of shift registers used.

Figure 7A:
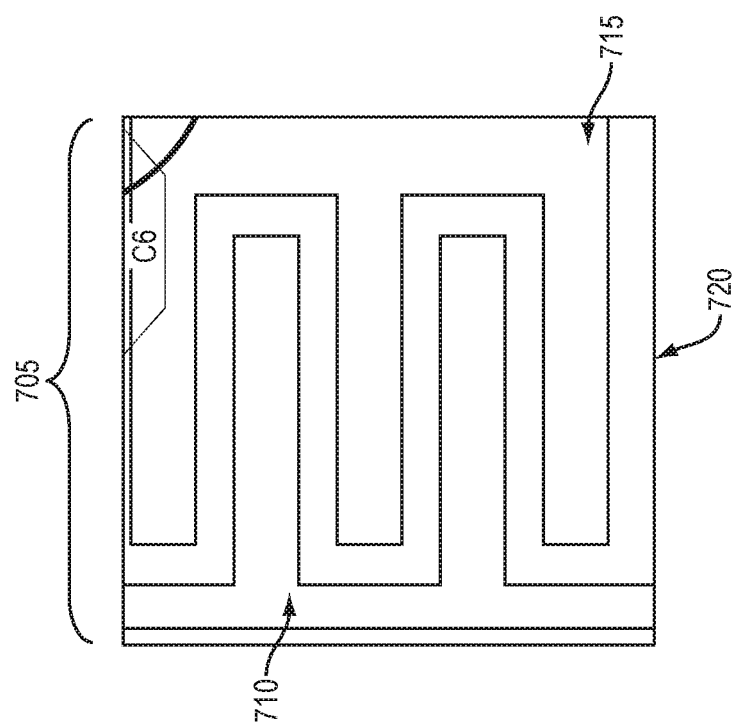
FIGS. 7A-7F illustrate a detailed view and circuits of touch points of the PCB layer.

FIGS. 7A-7F show a detailed view and circuits of touch points of the PCB layer 150. As shown in FIG. 7A, a single touch point 705 of the PCB layer 150 may include at least two sets of conductors 710, 715 that are insulated from one another by a non-conductive gap 720. In an embodiment, for tactile sensing of whether a pill is present in a region of the blister pack 120 (when inserted into the case cover 110), one of the conductor sets (e.g., the conductors 710) will receive a voltage input signal while voltage output signal will be read from another conductor set (e.g., the conductors 715). If the touch point 705 makes no detection (e.g., when there is no blister packet 120 or a region (e.g., container) of the blister packet 120 is empty), no voltage output signal will be read from another conductor set. For the touch point 705 to make a detection (e.g., when a region of the blister pack 120 has a pill in a container), a closed circuit must be established between the two insulated conductor sets 710, 715 with the elastomeric connector layer 130.

Figure 7B:
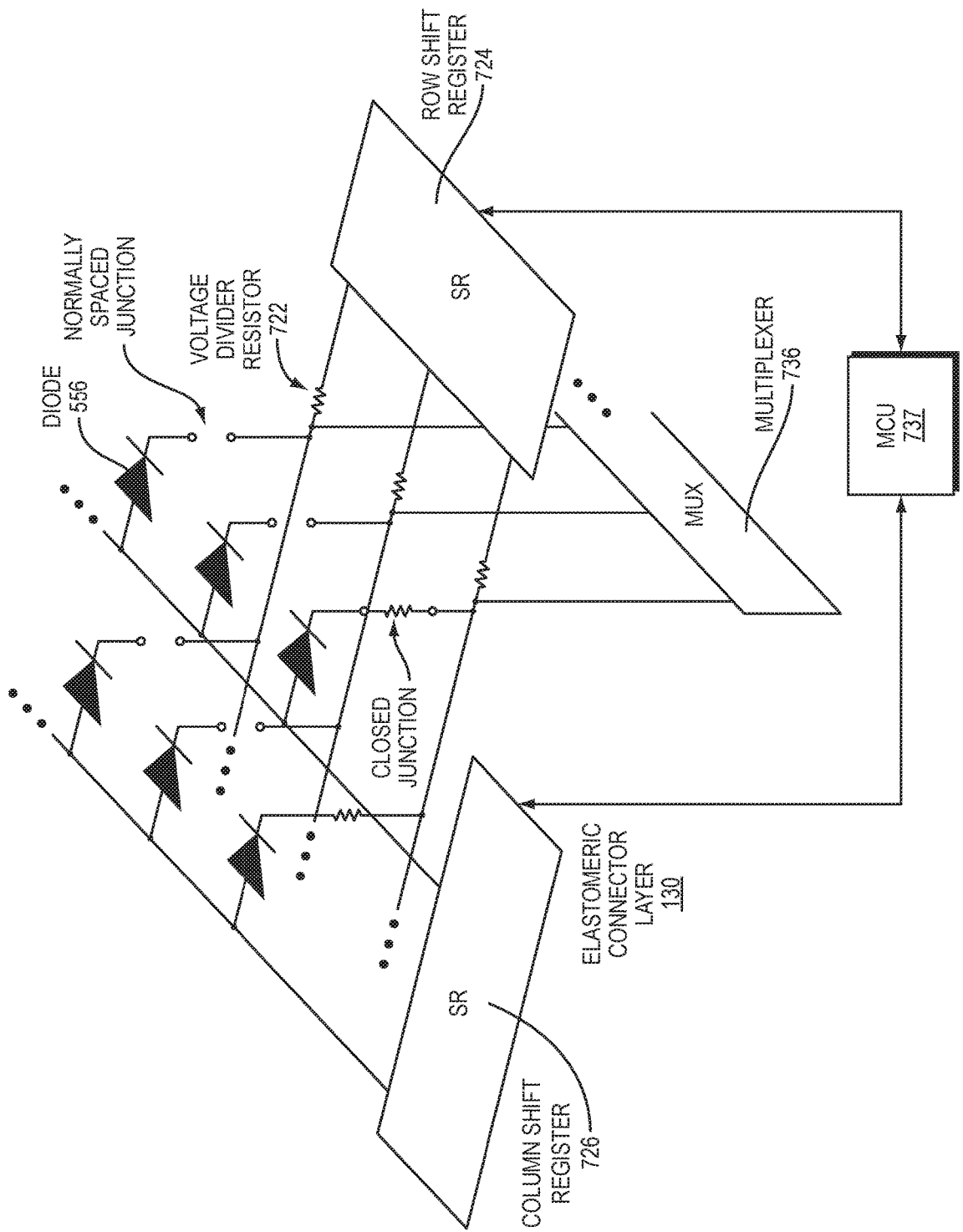

Turning to FIG. 7B, FIG. 7B shows a sensor circuit diagram for components of an object-detecting device, particularly elastomeric connector layer 140 and touch points of a PCB layer 150. As shown, PCB layer 150 contains conductive pads (e.g., touch points), the diodes 556, and resistors 722 placed in a regular matrix pattern such that each diode position can be determined by a row and a column number in a Cartesian coordinate system. The diodes can prevent the ghosting phenomenon, and a variety of different diodes can be used, including normal low-cost diodes, dual diodes, or light-emitting diodes (LEDs). Each diode is coupled to each conductive pad, and each conductive pad has two parts that are separated by an insulating junction. The two parts act as a switch that is open when no pressure is applied to the elastomeric connector layer 130 and closed when pressure is applied.

When the elastomeric connector layer 130 comes in contact with a conductive pad, the switch is closed, which may be described as a voltage divider consisting of a diode, the conductive pad, the elastomeric connector layer 130, and a variable resistor 722. The harder the elastomeric connector layer 130 is pressed against the conductive pad, the lower the resistance and the higher the voltage output from the voltage divider. If multiple conductive pads are in contact with the elastomeric connector layer 130, multiple switches will close.

Shift registers 724 and 726 control the rows and columns respectively of electrodes and are activated in a predetermined pattern. When the elastomeric connector layer 130 is pressed against a conductive pad, an MCU 737 controls the serial input to the shift registers, which are cascaded to one another to expand the number of channel outputs, by selecting the specific rows or columns of diode(s) to be driven as forward biased or not. The MCU 737 may also control a plurality of multiplexers 736, which receive voltage readings from each circuit to map out the contour of the object being pressed against the conductive pad.

For example, consider a scenario with an eight-channel output shift register controlling the column electrodes and a four-channel output shift register controlling the row electrodes. To determine whether a conductive pad at column one, row two is being contacted by the elastomeric connector layer, the column shift register 726 will generate output "10000000" while the row shift register 724 will generate a parallel output "10111111". Whenever a channel of a multiplexer (of the plurality of multiplexers 736) has an output of "1", the conductive trace connected to it will have voltage "high", and whenever the channel has an output of "0", the conductive trace will have a voltage of "low" or "Gnd". When two channels are shorted by the elastomeric connector layer 130, the diodes and the elastomeric connector layer ensure that current flows in only one possible direction.

Figure 7C:
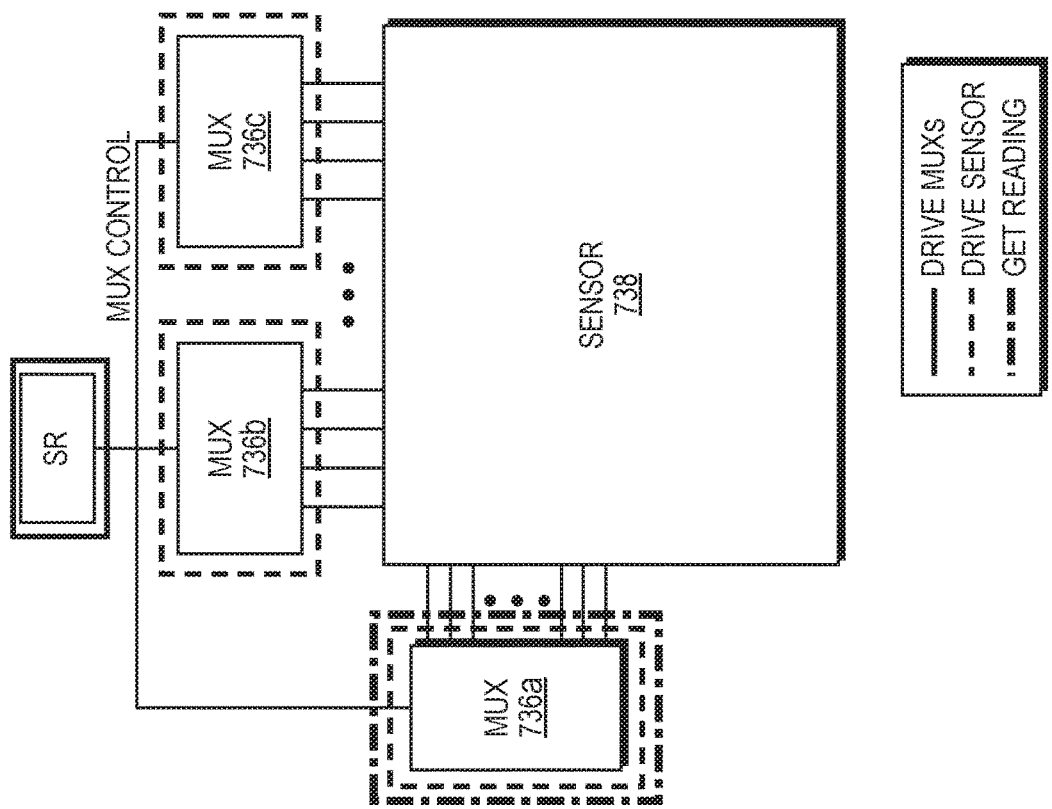
Figure 7D:
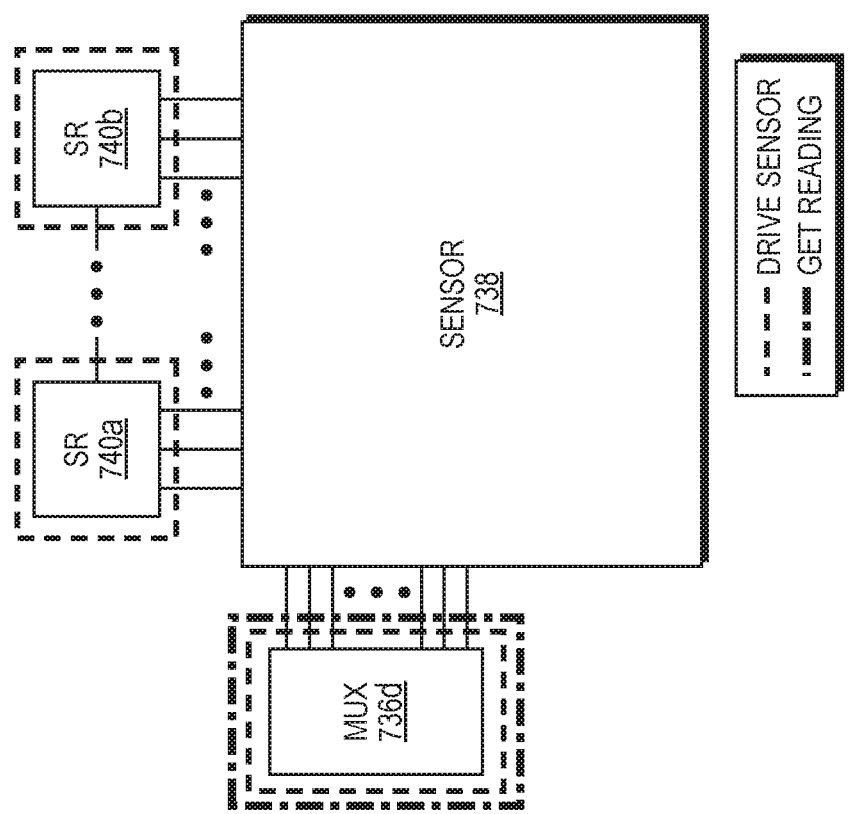
Figure 7E:
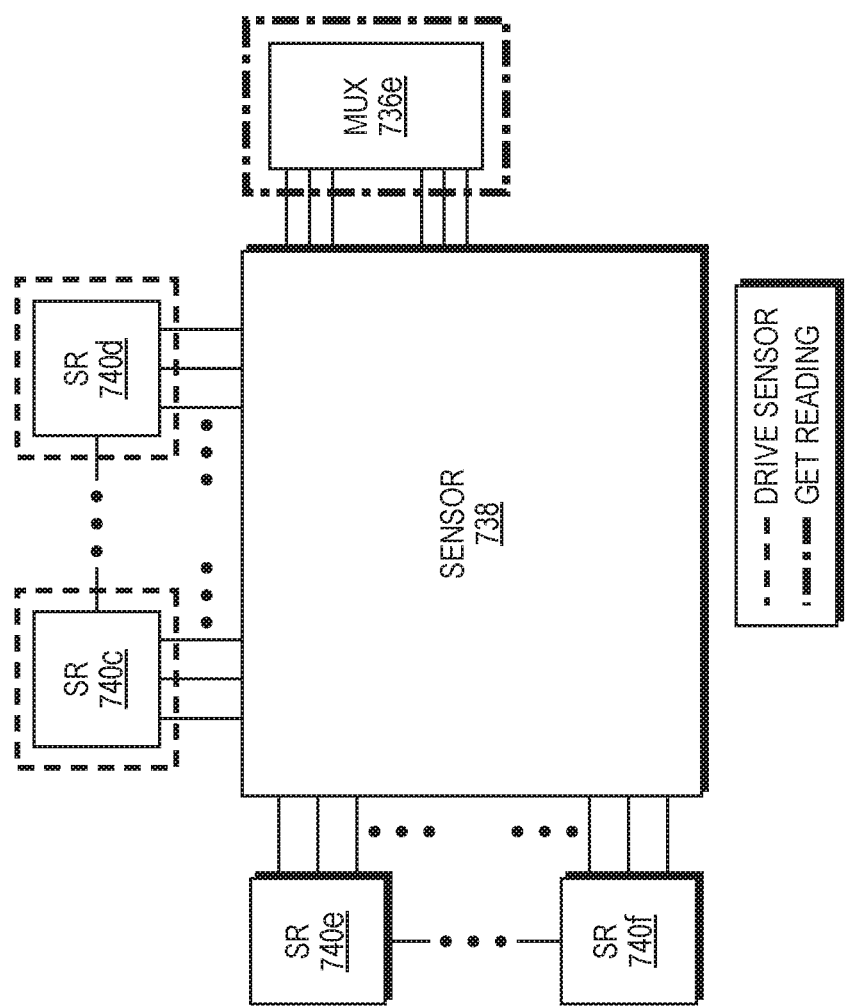

Various arrangements of the plurality of multiplexers 736 used to drive sensor(s) 738 of the PCB layer 150 are shown in FIGS. 7C-7E. In particular, as shown in FIG. 7C, in one embodiment, only multiplexers 736a-736c are used to drive the sensor(s) 738. Some of the multiplexers 736a-736c are used to drive the columns, while others are used to drive the rows. Other than driving the sensors 738, the multiplexers 736a-736c at either the rows or columns are also used to get sensor readings. Serial registers (e.g., shift registers) may also be used. However, in this specific embodiment, the serial registers will not be directly driving the sensors. Instead, they will be used to drive the multiplexers 736a-736c. In this way, the number of input and output pins required from the MCU to interface with the sensors may be reduced.

In another embodiment, as shown in FIG. 7D, a combination of multiplexers 736d and shift registers 740a-740b is used to drive the sensors 738. The shift registers 740a-740b are used to drive the columns, and the multiplexers 736d are used to drive the rows, or vice versa. In this specific embodiment, the multiplexers 736d serve an extra function, which is to get sensor readings.

In another embodiment, as shown in FIG. 7E, shift registers 740c-740f are used to drive the sensors 738. Some of the shift registers 740c-740f are used to drive the columns while other shift registers 740c-740f are used to drive the rows. In this specific embodiment, the multiplexers 736e, however, will not be used to drive the sensors 738. Instead, they will be used to get the readings from the sensor 738.

Figure 7F:
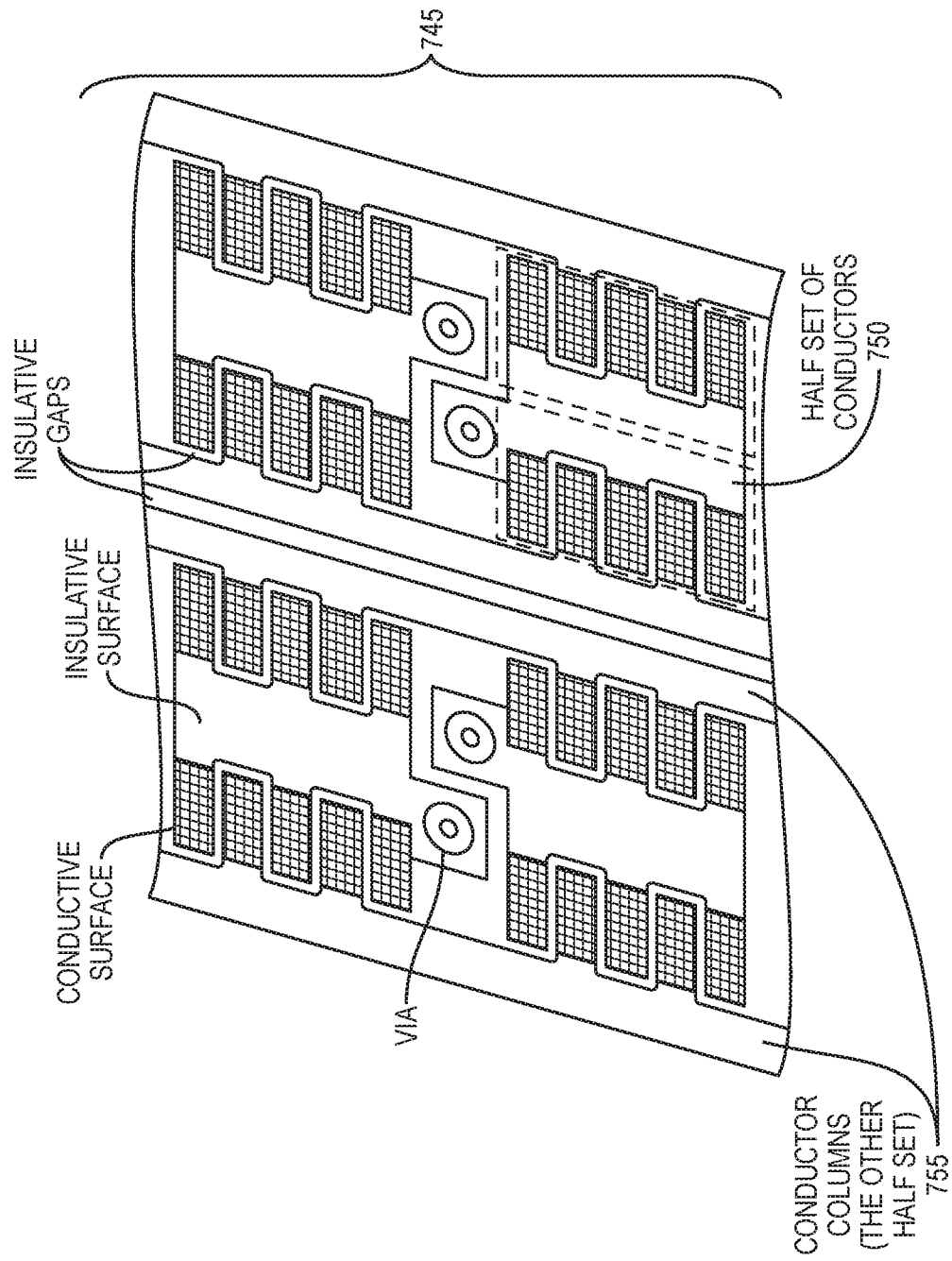

Turning to FIG. 7F, a plurality of touch points 745 is shown along with a particular arrangement of conductor sets in the plurality of touch points. In an embodiment, to economize the number of components needed to do sensing, a channel 750 of a shift register can be connected to, for example, four half sets of conductors within four touch points. The four half sets of conductors that connect to the shift registers act as voltage signal input points. The signal inputs are driven by the shift registers which output voltage signal a "high" or "low".

The other half set of conductors are arranged and divided into columns 755. Every column is selectively connected to other columns. All connected columns are divided into (but not limited to) four groups, and thus there will be four groups of conductive traces, each group carrying their own signal outputs gathered from the touch points. An MCU can determine positions of each pressed touch point of the plurality of touchpoints 745 and the press strength by decoding the signal output gathered from the columns. Decoding and determining whether a pill is present in a region of a blister pack 120 is based on knowing the column group, signal strength and the shift register channel that is activated.

In the embodiment, the problem known as ghosting, as described herein above, may occur. To address this, the shift register can be programmed to output specific signal levels to each half set of conductors the shift register is connected to. The touch point to be measured will have one of the half sets to receive a high signal from the shift register. The half sets of other conductive points surrounding the specified touch point will receive a low signal from the shift register, thereby reducing false negative signals that may arise due to ghosting.

Figure 8B:
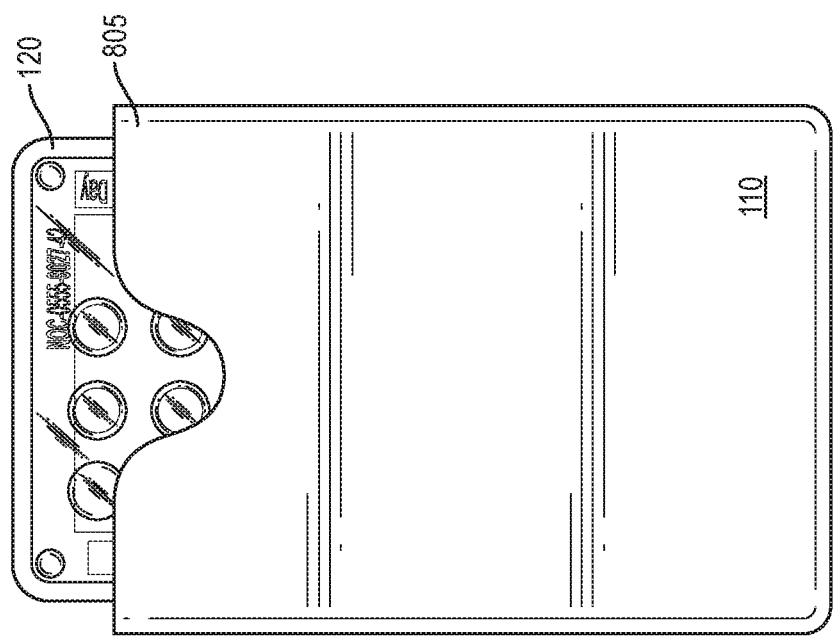
Figure 8C:
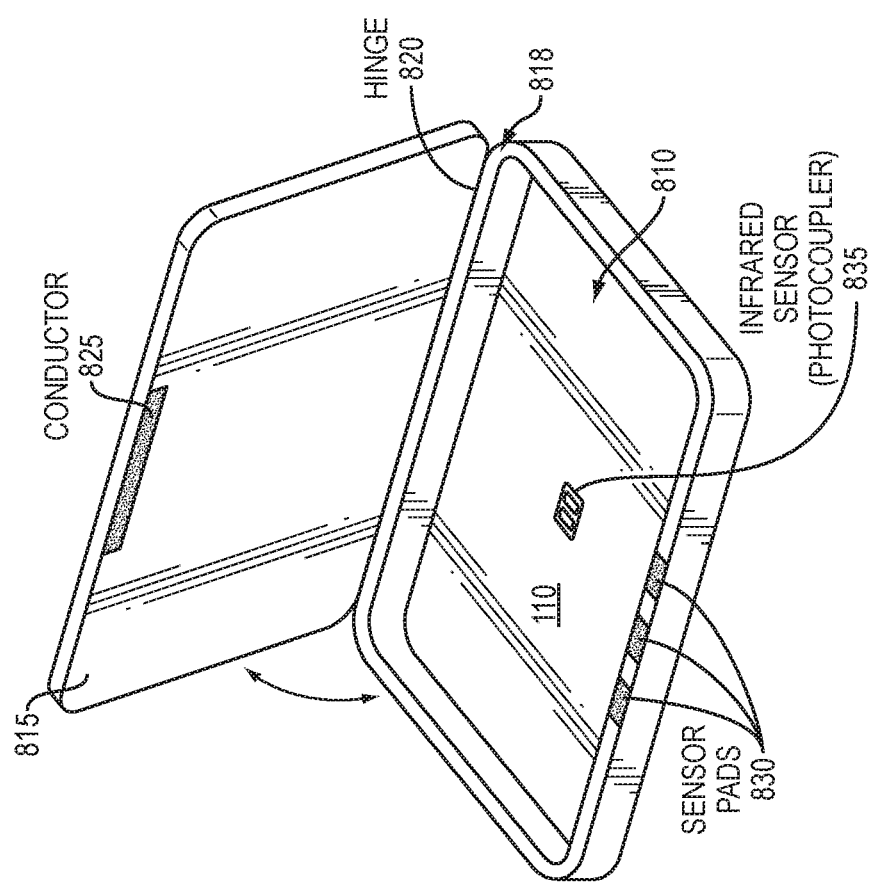

With reference to FIGS. 8A-8C, example structural embodiments of the case cover 110 of a pill detection device are shown. In particular, as shown in FIG. 8A, the case cover 110 is shown as a slide-in style case that receives the blister pack 120 by inserting (or sliding) the blister pack 120 into an opening 805 of the case cover 110. It is to be understood that the case can have various physical modifications the prevent a user from inserting the blister pack 120 into the opening 805 case cover 110 with pills of the blister pack 120 facing a certain direction (towards or away from the PCB layer 150) or with one end of the blister pack 120 entering the opening 805 before another end of the blister pack 120. Turning to figure FIG. 8B, the case cover 110 with the blister pack 120 partially inserted into the opening 805 is shown. Depending on the width of the opening of the case, a rectangular blister pack can, for example, either slide in with its longer side or shorter side.

Turning to FIG. 8C, the case cover 110 is shown as a clam shell style case that receives the blister pack 120 by in compartment 810 of the case cover 110. The case cover 110 includes a lid 815 that can be closed (at a hinge 820), as to provide protection for the blister pack 120 and for sensing of properties of the blister pack 120.

With more detail regarding the clam shell style case of the case cover 110 shown in FIG. 8C, the case cover 110 (as a pill receiving container) may optionally contain additional sensors and/or modules. In particular, the additional sensors and/or modules can include:

- A rotary sensor or flex sensor located within the hinge 820 of the case cover 110 that senses when the lid 815 is opened. The rotary sensor inside the hinge 820 may be a variable resistor connected to a voltage divider which gives out different voltage readings when the hinge 820 rotates or in other words when the lid 815 of the case is flipped opened. In another embodiment, a flex sensor 818 may be present in the hinge 820. This flex sensor 818 can detect an opening action of the lid 815.
- A switch located at a snap fit of the case cover 110 that senses when the case cover 110 is opened or closed. In this embodiment, there is a line of conductors 825 on the lid 815 of the case cover 110 which forms the first part of the snap fit. When the lid 815 is snapped closed (e.g., flushed with the compartment 810), the line of conductors 825 will short circuit the sensor pads on the other part of the snap fit, and thus a change in reading will be produced when the case cover 110 is closed or opened.
- A gyroscope and/or accelerometer that senses whether the case or case cover 110 is altered. If the case is moved by the user, the gyroscope or accelerometer will pick up the difference and log time related information when the case is altered.
- A capacitive sensor 830 that senses human (e.g., user) touch of the case cover 110. When capacitive sensor 830 detects human touch, it logs time related information when the detected touch is sensed.

A pressure (weight) sensor that senses weight located in the compartment 810. When the lid 815 is closed with a blister pack 120 in the case cover 110, the pressure sensor can sense the weight of the blister pack 120 pressing against it. When the case cover 110 is opened, the wall of the case will not be pressed against and a difference in reading will be sensed.

An IR sensor 835 configured to measure changes to properties within the compartment 810. The IR sensor 835 can be configured to detect when the blister pack 120 is taken away from the case cover 110 using different readings (compared to when the blister pack 120 is in the compartment 810) and deduce that the blister pack 120 has been taken away from the case cover 110. All of these is based on the different strength of IR signals reflected off from the Pill pack when it is situated at different distance from the IR sensor.

For energy saving purposes, in an embodiment, the additional sensors and/or modules used can also provide a wake up interrupt signal to the MCU of a pill detection device, so that the MCU will only take readings when the case cover 110 is opened. If the case cover 110 is not opened, the MCU can be in sleep mode (e.g., a lower energy mode) to conserve energy.

Figure 9A:
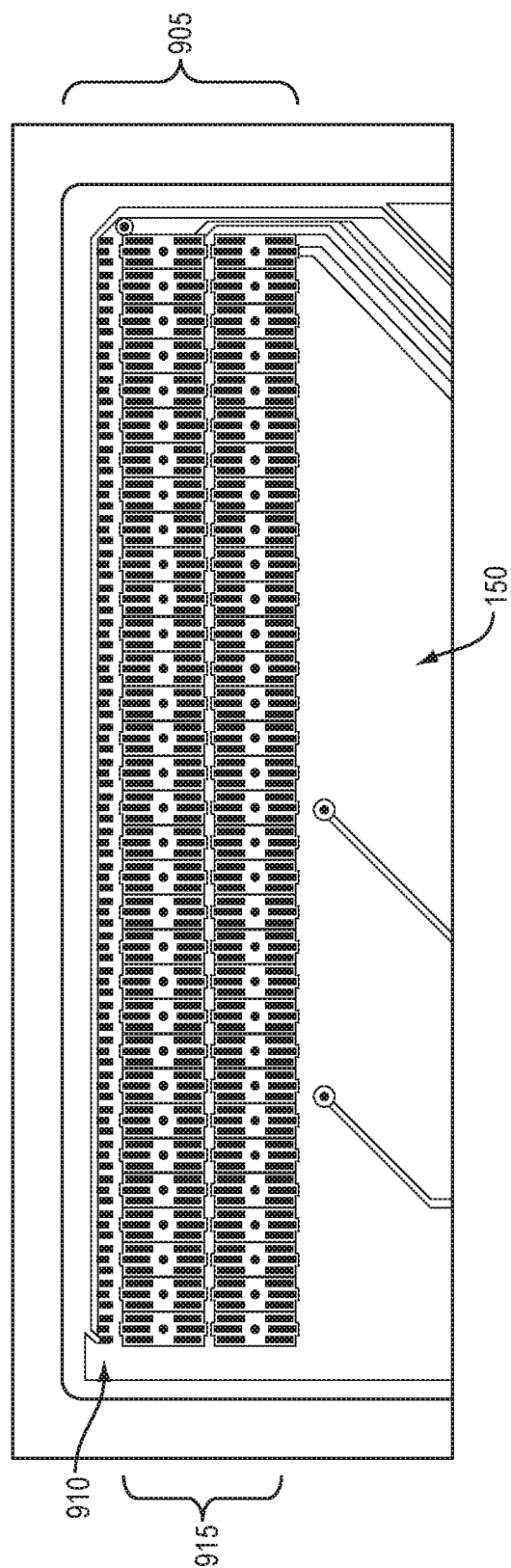

With reference to FIGS. 9A-9B, an alternative embodiment of a tactile pill detection device is shown. FIG. 9A shows a view of the PCB layer 150. The PCB layer 150 includes a plurality of touch point rows 905, where a top most row 910 of the plurality is configured to act as an interrupt signal sensor, and the remaining rows 915 are configured to act as tactile sensor points similar to what was described above in FIG. 1A. Turning to FIG. 9B, an exploded schematic view of the alternative embodiment of the tactile pill detection device is shown, where the tactile pill detection device includes an insulating sheet 920, an elastomeric connector layer 925, and the PCB layer 150.

The top most row 910 of the plurality is configured to act as an interrupt signal sensor for energy saving purposes. The interrupt signal can be transmitted by a debouncing circuit that can be adjusted depending on how fast the interrupt signal sensor needs to react to changes. When a blister pack 120 slides in either direction directly on top of the top most row 910, an interrupt signal is triggered by the top most row 910 (e.g., caused by an MCU). The interrupt signal can cause the remaining rows 915 to begin sensing operations. The remaining rows 915 can be controlled by shift registers, which in response to the receiving the interrupt signal, can be configured to cause a sequence of scanning (e.g., individual activations of particular touch points) by the touch points of the remaining rows 915 (as the blister pack 120 is moved over the remaining rows). The order and number of the rows are not limited to what is being shown in the picture. In one embodiment, the interrupt signal sensor 910 is placed between lines of tactile sensors 915.

In one embodiment, the readings from the tactile sensor 915 will pass through a signal processing unit which may contain an operational amplifier. The signal output from the signal processing unit can be sent into the MCU. The MCU can perform an algorithm that takes the signal output and transforms it into a matrix, which can be used by the MCU (or another computing device) to determine pill count and pill location of a blister pack.

With reference to FIG. 10, an embodiment of a pill detection device including a plurality of IR sensors is shown. As shown, a PCB layer 1000 for a pill detection device includes a row of IR sensors 1005 are shown and a row of tactile sensors 1010 above the row of IR sensors 1005. In some embodiments, the IR sensors of the row of IR sensors 1005 (e.g., optocouplers) are arranged uniformly and packed tightly to cover the whole surface (e.g., a blister pack) to be measured and detected. In other embodiments, the IR sensors of the row of IR sensors 1005 are arranged in a straight line. In an example, two rows of IR sensors can be used for the pill detection device (both below the row of IR sensors tactile sensors 1010), where each row of the rows of IR sensors includes, but is not limited to, 16 IR optocouplers.

The row of tactile sensors 1010 can be configured for blister pack 120 detection and energy saving purposes. In particular, when the blister pack 120 slides into the case cover 110, the row of tactile sensor 1010 detects the sensor reading as an interrupt signal and triggers a wake up of an MCU of the pill detection device. In response, the MCU can be configured to control the row of IR sensors 1005 (to measure and determine the position of pills and the sliding direction of the blister pack 120) with multiplexers.

The row of IR sensors 1005 can include optocouplers including IR emitters and IR collectors (or detectors). The IR emitters emit light at particular IR wavelengths. When the IR wavelengths bounce off a surface (e.g., a blister pack 120) and reach back to IR collectors, the IR collectors are configured to measure the reflected IR wavelengths. Based on the reading from the IR collector, the pill detection device can determine a reflectivity of the surface or the distance between the surface and the optocoupler.

For every optocoupler, the IR emitter and IR collector are connected to different multiplexers. Both the IR emitters and the IR collectors can be controlled by multiplexers of the pill detection apparatus to orchestrate measurements by the IR sensors (e.g., to ease control of large numbers of optocouplers and enable high speed scanning). In some embodiments, the MCU that controls the multiplexers may be controlled by shift registers. In particular, based on control signals received from an MCU of the pill detection device, the multiplexers can be configured to select particular IR emitters (in the row of IR sensors 1005) to shine IR wavelengths and particular IR collectors (in the row of IR sensors 1005) to measure the reflected IR signals. Similar to as described above, the MCU can be configured to determine whether a pill is present in the blister pack 120 using the measured IR readings.

Figure 11:
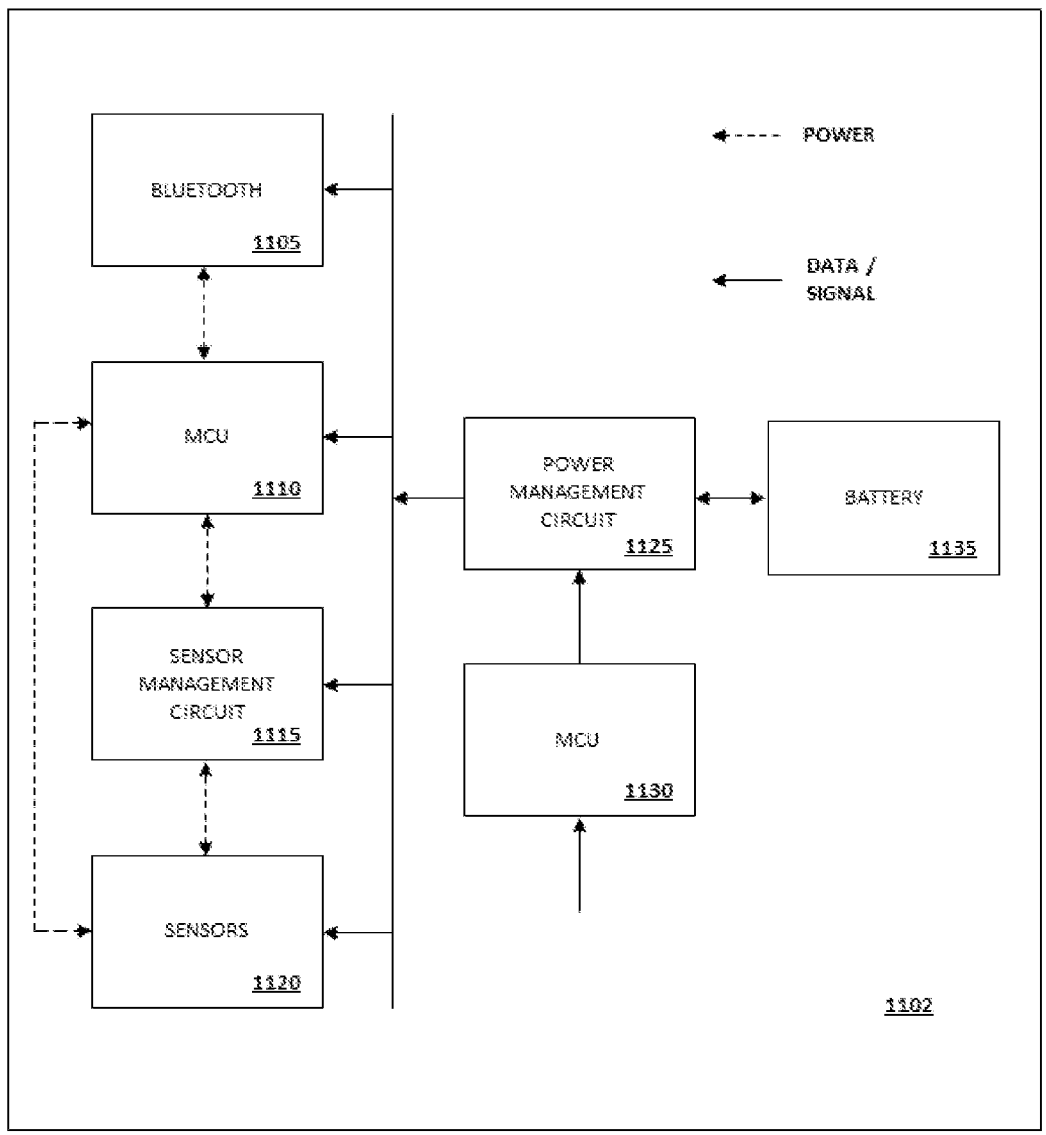
FIG. 11 illustrates an electronic block diagram of a pill detection device.

With reference to FIG. 11, an electronic block diagram 1100 of a pill detection 1102 device as described herein is shown. In particular, the pill detection device can include a Bluetooth® (e.g., IEEE 802.15.1) communications module 1105 (e.g., Bluetooth Low Energy®, also known as BLE), an MCU 1110, a sensor management circuit 1115, sensors (e.g., touch points 468, 705 as described herein above) 1120, a power management circuit 1125, a charger 1130, and a battery 1135. In lieu or in addition of the Bluetooth® communications module 1105, the pill detection device 1102 can include a cellular data (e.g., 3G, LTE, etc.) communications module, a Wi-Fi® (e.g., IEEE 802.11) communications module, and/or a near field communications (NFC) module.

Figure 12:
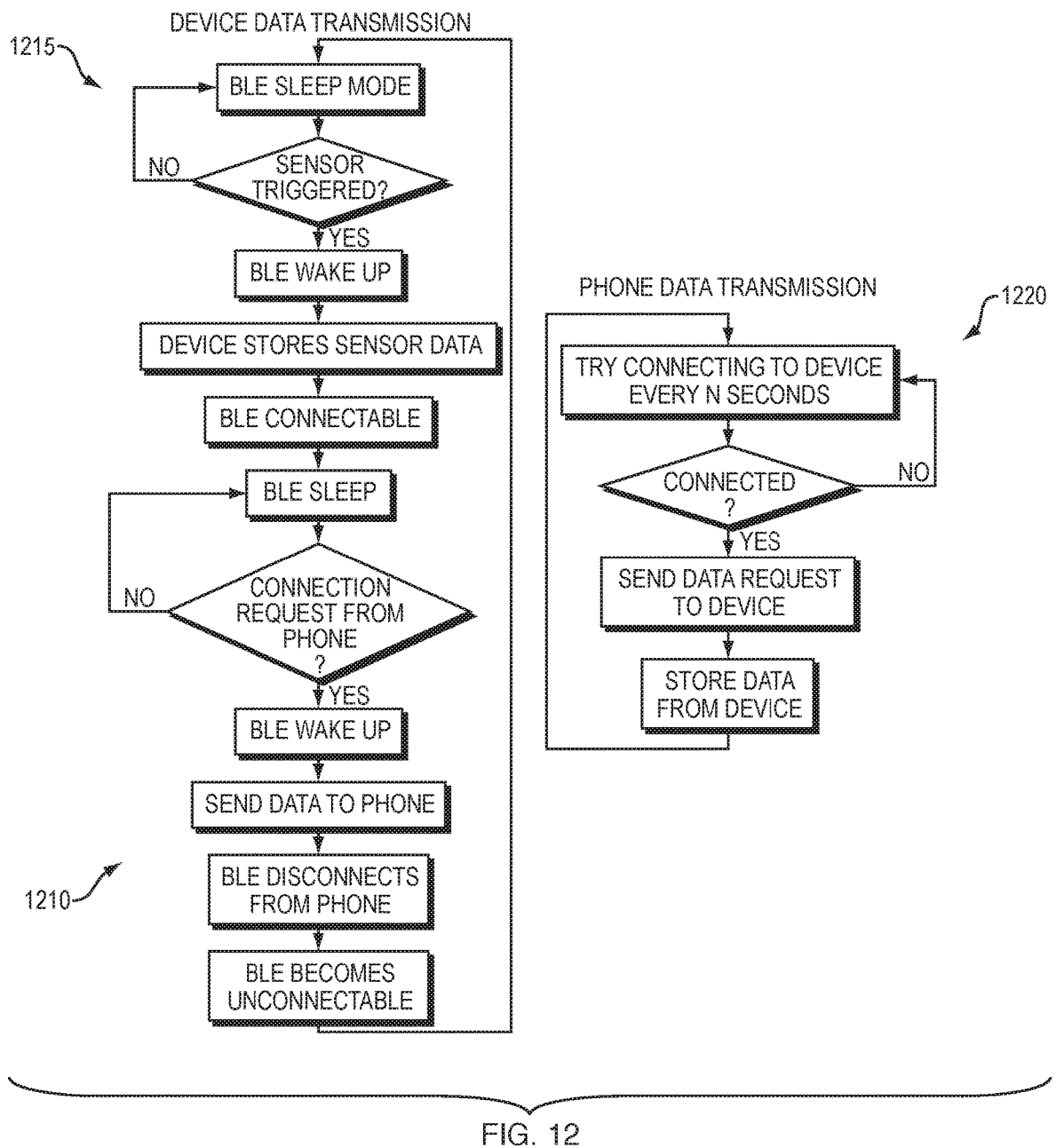
FIG. 12 illustrates a logic flow diagram of communications between a pill detection device and a cell phone, smartphone, or any other end user device.

FIG. 12 illustrates a logic flow diagram of communications between a pill detection device and a cell phone, smartphone, or any other end user device. As shown, there can be a flow of Bluetooth® communications 1210 between a Bluetooth® communications module of a pill detection device and a cell phone. In particular, communications 1215 (e.g., blister pack 110 data indicative of pill count and/or presence) from the pill detection device to the cellphone is shown as well as communications 1220 (e.g., commands or instructions) from the cellphone to the pill detection device.

Figure 13:
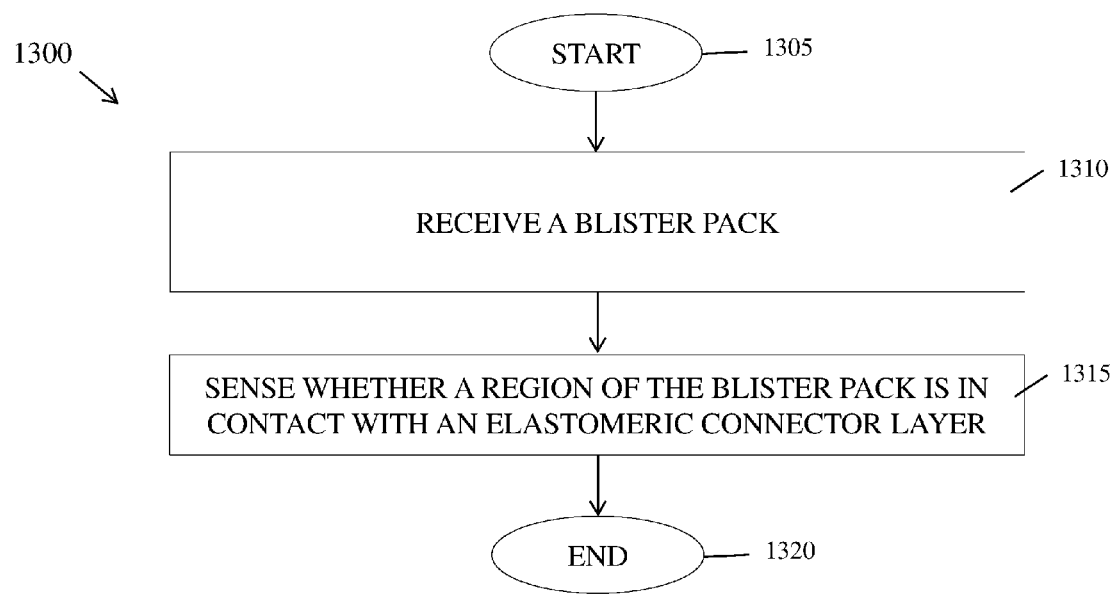
FIG. 13 illustrates an example simplified procedure for detecting and determining a number of pills and positions of the pills in a blister pack.

FIG. 13 illustrates an example simplified procedure for detecting and determining a number of pills and positions of the pills in a blister pack in accordance with one or more embodiments described herein. For example, a non-generic, specifically configured device (e.g., device 1102) may perform procedures 1300 by executing stored instructions (e.g., at a MCU 1110).

With reference to FIG. 13, a procedure 1300 may start at step 1305, and continues to step 1310, where, as described in greater detail above, the device, for example, a pill detection apparatus, may receive a blister pack. In particular, the pill detection apparatus can comprise a blister pack receiving container; an elastomeric connector layer; and a printed circuit board (PCB) layer disposed beneath the elastomeric connector layer, the PCB layer including a plurality of touch points. The pill detection apparatus may further comprise a thin insulating sheet disposed on top of the elastomeric connector layer (e.g., made of PET). The blister pack receiving container can be in a slide-in style case or a clam shell style case. Further, the plurality of touch points can include 512 touch points.

At step 1315, as described in greater detail above, the device may sense whether a region of the blister pack is in contact with an elastomeric connector layer. Further, the device may be configured to transmit a message indicating whether the respective region of the blister pack is in contact with the elastomeric connector layer (by a communications module in communications with the PCB layer). The communications module can be of BT® communications hardware, a cellular data (e.g., 3G, LTE, etc.) communications module, Wi-Fi® communications hardware, and NFC communications hardware. Procedure 1300 then ends at step 1320.

It should be noted that while certain steps within procedure 1300 may be optional as described above, the steps shown in FIG. 13 are merely examples for illustration, and certain other steps may be included or excluded as desired. Further, while a particular order of the steps is shown, this ordering is merely illustrative, and any suitable arrangement of the steps may be utilized without departing from the scope of the embodiments herein. Moreover, while procedure 1300 is described separately, certain steps from each procedure may be incorporated into each other procedure, and the procedures are not meant to be mutually exclusive.

While there have been shown and described illustrative embodiments that provide for detecting and determining a number of pills and positions of the pills in a blister pack, it is to be understood that various other adaptations and modifications may be made within the spirit and scope of the embodiments herein. For example, while certain embodiments are described herein with respect for use with blister packs comprising pills (e.g., birth control pills), other types of blister packs are contemplated. Additionally, disclosed arrangements or uses of certain sensors (e.g., tactile sensors and/or IR sensors) can be used in other applications like shallow surface pattern detection and mapping, reflective object detection and counting, braille translation, and/or sensing for robotic arms.

The foregoing description has been directed to specific embodiments. It will be apparent, however, that other variations and modifications may be made to the described embodiments, with the attainment of some or all of their advantages. For instance, it is expressly contemplated that the components and/or elements described herein can be implemented as software being stored on a tangible (non-transitory) computer-readable medium (e.g., disks/CDs/RAM/EEPROM/etc.) having program instructions executing on a computer, hardware, firmware, or a combination thereof. Accordingly this description is to be taken only by way of example and not to otherwise limit the scope of the embodiments herein. Therefore, it is the object of the appended claims to cover all such variations and modifications as come within the true spirit and scope of the embodiments

What is claimed is:

1. A pill detection apparatus, comprising:
   a blister pack receiving container;
   an elastomeric connector layer; and
   a printed circuit board (PCB) layer disposed beneath the elastomeric connector layer, the PCB layer including a plurality of touch points, wherein each touch point of the plurality of touch points is configured to, when the blister pack is disposed on top of the elastomeric connector layer with a respective region of the blister pack compressing the elastomeric layer due to a default form of the respective region, sense that the respective region of the blister pack is in contact with the elastomeric connector layer and includes a pill.

2. The pill detection apparatus of claim 1, further comprising:
   a thin insulating sheet disposed on top of the elastomeric connector layer.

3. The pill detection apparatus of claim 2, wherein the thin insulating sheet is at least one polyethylene terephthalate (PET) sheet.

4. The pill detection apparatus of claim 1, wherein the blister pack receiving container is a slide-in style case.

5. The pill detection apparatus of claim 1, wherein the blister pack receiving container is a clam shell style case.

6. The pill detection apparatus of claim 1, further comprising:
   a communications module in communication with a microcontroller unit (MCU), the communications module configured to transmit a message indicating whether the respective region of the blister pack is in contact with the elastomeric connector layer.

7. The pill detection apparatus of claim 6, wherein the communications module transmits the message to a smartphone.

8. The pill detection apparatus of claim 6, wherein the communications module includes hardware selected from the group consisting of Bluetooth® (BT) communications hardware, Wi-Fi® communications hardware, and near field communication (NFC) communications hardware.

9. A method, comprising:
   receiving, by a blister pack receiving container including an elastomeric connector layer disposed on top of a printed circuit board (PCB) layer that includes a plurality of touch points, a blister pack; and
   sensing, by a touch point of the plurality of touch points, whether a respective region of the blister pack is in contact with the elastomeric connector layer due to a respective region of the blister pack compressing the elastomeric layer due to a default form of the respective region.

10. The method of claim 9, wherein the blister pack receiving container further includes a thin insulating sheet disposed on top of the elastomeric connector layer.

11. The method of claim 10, wherein the thin insulating sheet is at least one polyethylene terephthalate (PET) sheet.

12. The method of claim 9, wherein the blister pack receiving container is a slide-in style case.

13. The method of claim 9, wherein the blister pack receiving container is a clam shell style case.

14. The method of claim 9, further comprising:
transmitting, by a communications module in communication with a communications module in communication with a microcontroller unit (MCU), a message indicating whether the respective region of the blister pack is in contact with the elastomeric connector layer.

15. The method of claim 14, wherein the communications module transmits the message to a smartphone.

16. The method of claim 14, wherein the communications module includes hardware selected from the group consisting of Bluetooth® (BT) communications hardware, Wi-Fi® communications hardware, and near field communication (NFC) communications hardware.

17. A pill detection apparatus, comprising:
a blister pack receiving container including a printed circuit board (PCB) layer, the PCB layer including a plurality of infrared (IR) sensors, wherein the plurality of IR sensors is configured to:
  detect whether a blister pack is placed within the blister pack receiving container; and
  in response to detecting that the blister pack is placed within the blister pack receiving container, sense that a respective pill is not within a respective region of the blister pack.

18. The pill detection apparatus of claim 17, further comprising:
a communications module in communication with the PCB layer, the communications module configured to transmit a message indicating that the respective pill is not within the respective region of the blister pack.

19. The method of claim 1, wherein each touch point of the plurality of touch points is further configured to, when the blister pack is disposed on top of the elastomeric connector layer and the default form of the respective region has been mutated, sense that the respective region of the blister pack does not include the pill.

20. The pill detection apparatus of claim 17, further comprising:
a plurality of multiplexers in communication with the PCB layer, wherein the plurality of multiplexers is configured to:
  select a first set of IR sensors from the plurality of IR sensors, wherein the first set of IR sensors emits IR light at a plurality of wavelengths;
  select a second set of IR sensors from the plurality of sensors, wherein the second set of IR sensors derives a measurement from a plurality of reflected wavelengths, the plurality of reflected wavelengths corresponding to the emitted IR light reflected off a surface; and
  determine, based on the measurement, whether the surface is a pill.

* * * * *

UNITED STATES PATENT AND TRADEMARK OFFICE
CERTIFICATE OF CORRECTION

PATENT NO. : 10,561,581 B2  
APPLICATION NO. : 16/201387  
DATED : February 18, 2020  
INVENTOR(S) : Wong et al.

Page 1 of 1

It is certified that error appears in the above-identified patent and that said Letters Patent is hereby corrected as shown below:

In the Claims

Column 14, Line 5, In Claim 19, delete "method" and insert --pill detection apparatus--

Signed and Sealed this
Sixteenth Day of February, 2021

Drew Hirshfeld
*Performing the Functions and Duties of the*
*Under Secretary of Commerce for Intellectual Property and*
*Director of the United States Patent and Trademark Office*